(12) United States Patent
Kawai et al.

(10) Patent No.: US 11,750,173 B2
(45) Date of Patent: Sep. 5, 2023

(54) RESONATOR AND RESONANCE DEVICE

(71) Applicant: Murata Manufacturing Co., Ltd., Nagaokakyo (JP)

(72) Inventors: Ryota Kawai, Nagaokakyo (JP); Keisuke Takeyama, Nagaokakyo (JP); Yuichi Goto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 596 days.

(21) Appl. No.: 17/023,861

(22) Filed: Sep. 17, 2020

(65) Prior Publication Data

US 2021/0006230 A1   Jan. 7, 2021

Related U.S. Application Data

(63) Continuation of application No. PCT/JP2018/043411, filed on Nov. 26, 2018.

(30) Foreign Application Priority Data

Apr. 27, 2018   (JP) ................................ 2018-086610

(51) Int. Cl.
*H03H 9/24* (2006.01)
*H03H 9/02* (2006.01)
(Continued)

(52) U.S. Cl.
CPC ...... *H03H 9/2457* (2013.01); *H03H 9/02448* (2013.01); *H03H 9/0595* (2013.01); *H03H 9/1057* (2013.01)

(58) Field of Classification Search
CPC ............. B32B 15/013; H03H 9/02448; H03H 9/0595; H03H 9/1057; H03H 9/2457;
(Continued)

(56) References Cited

U.S. PATENT DOCUMENTS 10,749,496 B2   8/2020 Yoshii et al.
2011/0062831 A1*   3/2011 Amano ............... H03H 9/0595
                                                                310/370
(Continued)

FOREIGN PATENT DOCUMENTS

JP         201187274 A    4/2011
JP        2012065293 A    3/2012
(Continued)

OTHER PUBLICATIONS

International Search Report Issued for PCT/JP2018/043411, dated Jan. 1, 2019.

(Continued)

*Primary Examiner* — Naishadh N Desai

(74) *Attorney, Agent, or Firm* — ArentFox Schiff LLP

(57) ABSTRACT

A resonance device includes a resonator, an upper lid, and a lower lid. The resonator includes a vibration portion, a frame, and holding arms. The vibration portion includes a base and a plurality of vibration arms. The lower lid has a protruding portion protruding between two adjacent vibration arms, the protruding portion has an insulating film, the vibration arms have a weight portion that has a conductive film formed on the insulating film, and in a direction in which the plurality of vibration arms extend, a first distance between the weight portion of any one of the two adjacent vibration arms and the holding portion is less than a second distance between the weight portion and the protruding portion.

20 Claims, 14 Drawing Sheets

(51) Int. Cl.
*H03H 9/05* (2006.01)
*H03H 9/10* (2006.01)

(58) Field of Classification Search
CPC ... H03H 9/2489; H04L 1/1628; H04L 1/1671;
H04L 1/1678; H04L 1/1829; H04L
2001/0097; H04L 49/9015; H04W 84/18
See application file for complete search history.

(56) References Cited

U.S. PATENT DOCUMENTS

2017/0187351 A1\* 6/2017 Goto ............... B06B 1/0603
2019/0097600 A1\* 3/2019 Yoshii ............. H03H 9/1057

FOREIGN PATENT DOCUMENTS

| JP | 2015226242 A * | 12/2015 | ........... H03H 9/1035 |
| JP | WO-2016052260 A1 * | 4/2016 | |
| WO | 2016052260 A1 | 4/2016 | |
| WO | WO-2016052260 A1 * | 4/2016 | ........... B06B 1/0603 |
| WO | 2017208568 A1 | 12/2017 | |

OTHER PUBLICATIONS

Written Opinion of the International Searching Authority issued for PCT/JP2018/043411, dated Jan. 1, 2019.

\* cited by examiner

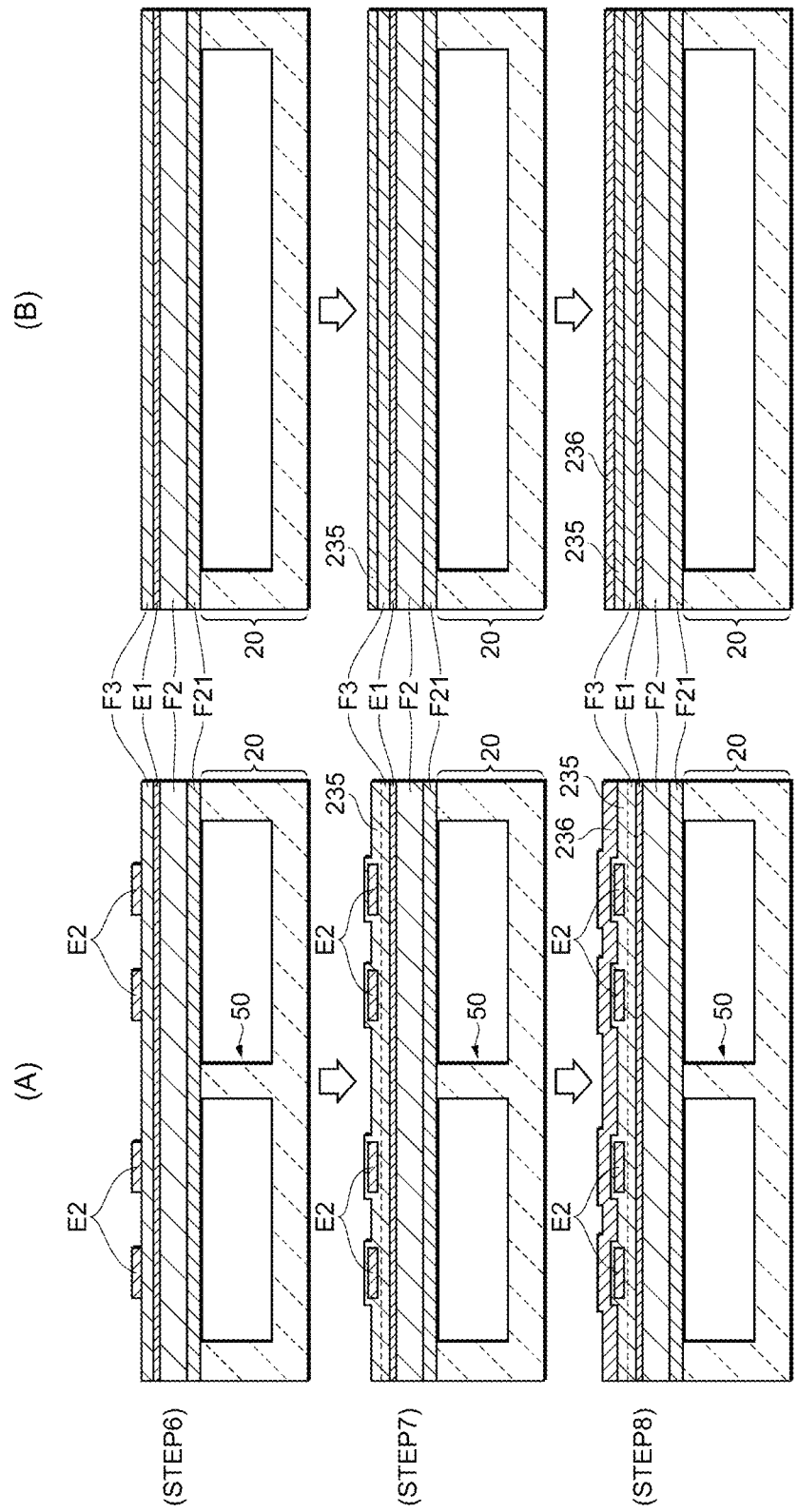

RESONATOR AND RESONANCE DEVICE

CROSS REFERENCE TO RELATED APPLICATIONS

The present application is a continuation of PCT/JP2018/043411, filed Nov. 26, 2018, which claims priority to Japanese Patent Application No. 2018-086610, filed Apr. 27, 2018, the entire contents of each of which are incorporated herein by reference.

TECHNICAL FIELD

The present invention relates to a resonator and a resonance device.

BACKGROUND

A resonator such as a piezoelectric vibrator has been used as a device for realizing a clocking function in an electronic device. With size reduction of electronic devices, resonators have also been required to be reduced in size, and resonators manufactured using a micro electro mechanical systems (MEMS) technology (hereinafter, also referred to as "MEMS vibrators") have attracted attention.

In the MEMS vibrator, a variation in a resonant frequency may occur due to manufacturing variation. Thus, a frequency is adjusted by additional etching or the like during or after manufacturing of the MEMS vibrator.

For example, Patent Document 1 (identified below) discloses a configuration in which, in a vibrator having a plurality of vibration arms, each of a mass part for coarse adjustment provided on a tip side of the vibration arm and a mass part for fine adjustment provided on a base end side of the vibration arm is reduced, thereby adjusting a resonant frequency.

Patent Document 1: Japanese Unexamined Patent Application Publication No. 2012-065293.

The mass part described in Patent Document 1 includes an insulator layer and a conductive layer formed on the insulator layer. In an MEMS vibrator, when the above-described mass part is formed, and an ion beam or the like is used to adjust a resonant frequency, the insulator layer is charged in some cases. When the MEMS vibrator vibrates in a state in which the insulator layer on the MEMS vibrator is charged, Coulomb force is generated by an electric charge in the insulator layer, and the resonant frequency fluctuates.

SUMMARY OF THE INVENTION

Accordingly, the exemplary embodiments of the present invention have been made in view of such a situation. Thus, it is an object of the present invention to suppress influence of an electric charge in an insulator layer in a resonator or in a conductive layer on the insulator layer on a resonant frequency.

In an exemplary embodiment, a resonance device is provided that includes a resonator including a vibration portion including a base and a plurality of vibration arms having a fixed end connected to the base and an open end provided away from the base, and extending from the fixed end to the open end. Moreover, the base and the plurality of vibration arms having a piezoelectric film, a lower electrode and an upper electrode provided so as to face each other with the piezoelectric film interposed therebetween, and an insulating film provided so as to cover the upper electrode. A frame is provided so as to extend on a side of the open end of the plurality of vibration arms, and a holding arm is provided for connecting the vibration portion to the frame. Furthermore, an upper lid is provided so as to face the upper electrode of the resonator, and a lower lid is provided so as to face the lower electrode of the resonator. In the exemplary embodiment, the lower lid has a protruding portion protruding between two vibration arms adjacent to each other of the plurality of vibration arms, the protruding portion having an insulating film, each of the vibration arms has a weight portion provided on the side of the open end and having a width larger than other parts in the vibration arm, the weight portion having a conductive film formed on the insulating film, and when a surface in the lower lid facing the lower electrode is viewed in plan, in a direction in which the plurality of vibration arms extend, compared to a first distance between the weight portion of any one of the two vibration arms adjacent to each other and the holding portion, a second distance between the weight portion and the protruding portion is larger than the first distance.

According to the exemplary embodiments of present invention, the influence of an electric charge in the insulator layer in the resonator or in the conductive layer on the insulator layer on a resonant frequency can be suppressed.

BRIEF DESCRIPTION OF DRAWINGS

FIG. 7B is a diagram illustrating the example of the process flow of the resonance device according to the first exemplary embodiment.

DETAILED DESCRIPTION OF EMBODIMENTS

First Exemplary Embodiment

Hereinafter, a first exemplary embodiment of the present invention will be described with reference to the accompanying drawings. It is noted that, in each of the drawings, a configuration for describing at least part of features in structure of a resonance device 1 is described, but it should be appreciated that the resonance device 1 can include alternative configuration not necessarily illustrated therein.

Figure 1:
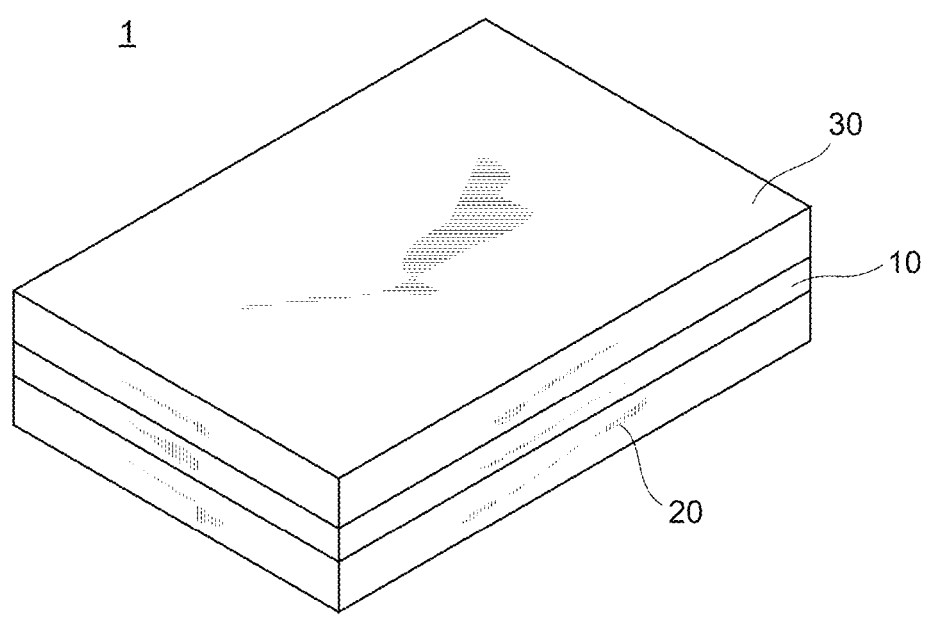
FIG. 1 is a perspective view schematically illustrating an external appearance of a resonance device according to a first exemplary embodiment.
Figure 2:
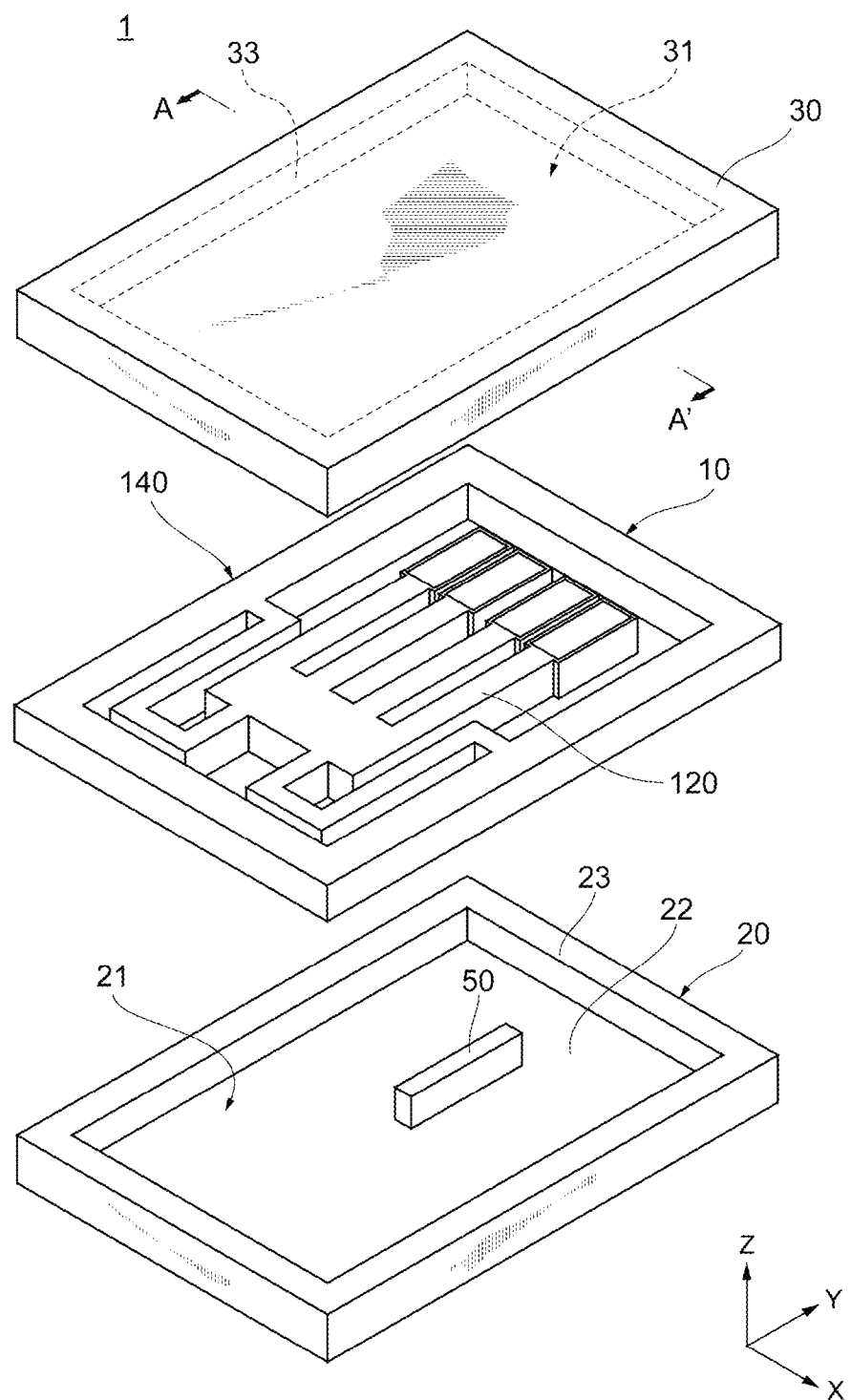
FIG. 2 is an exploded perspective view schematically illustrating a structure of the resonance device according to the first exemplary embodiment.

FIG. 1 is a perspective view schematically illustrating an external appearance of the resonance device 1 according to the first exemplary embodiment. Further, FIG. 2 is an exploded perspective view schematically illustrating a structure of the resonance device 1 according to the first exemplary embodiment.

As shown, the resonance device 1 includes a resonator 10, and an upper lid 30 and a lower lid 20 provided so as to face each other with the resonator 10 interposed therebetween. That is, the resonance device 1 is configured by laminating the lower lid 20, the resonator 10, and the upper lid 30 in this order.

Further, the resonator 10 is sealed by joining the resonator 10 and the lower lid 20, and joining the resonator 10 and the upper lid 30, and accordingly a vibration space of the resonator 10 is formed. Each of the resonator 10, the lower lid 20, and the upper lid 30 is formed by using a Si (silicon) substrate, for example. The respective Si substrates of the resonator 10 and the lower lid 20 are joined to each other, and the respective Si substrates of the resonator 10 and the upper lid 30 are joined to each other. Each of the resonator 10 and the lower lid 20 may be formed using a SOI substrate, for example. It is also noted that the lower lid 20 and the upper lid 30 may be joined to each other to seal the resonator 10 in the vibration space formed by the lower lid 20 and the upper lid 30.

According to the exemplary embodiment, the resonator 10 is a MEMS resonator manufactured by using a MEMS technology. Note that, in the present embodiment, the description will be given by using an example in which the resonator 10 is formed by using a Si substrate. In addition, in the following description, in the lower lid 20, a surface facing the resonator 10 is referred to as a front surface, and a surface opposite the front surface is referred to as a back surface. Further, in the upper lid 30, a surface facing the resonator 10 is referred to as a back surface, and a surface opposite the back surface is referred to as a front surface. In the resonator 10, a surface facing the lower lid 20 is referred to as a back surface, and a surface facing the upper lid 30 is referred to as a front surface. Similarly, in each of constituent elements of the resonator 10, a surface thereof facing the lower lid 20 is referred to as a back surface, and a surface thereof facing the upper lid 30 is referred to as a front surface. A direction from the lower lid 20 toward the upper lid 30 is referred to as an upward direction, and a reverse direction thereof is referred to as a downward direction.

Hereinafter, each configuration of the resonance device 1 will be described in detail.

Upper Lid 30

The upper lid 30 spreads in a flat plate shape along an XY-plane, and, for example, the back surface thereof is formed with a flat rectangular parallelepiped recessed portion 31. The recessed portion 31 is surrounded by a side wall 33, and forms part of the vibration space that is a space in which the resonator 10 vibrates.

Lower Lid 20

The lower lid 20 has a bottom plate 22 in a rectangular flat plate shape provided along the XY-plane, and a side wall 23 extending from the periphery of the bottom plate 22 in a Z-axis direction (that is, in a lamination direction of the lower lid 20 and the resonator 10). A surface of the lower lid 20 facing the resonator 10 is provided with a recessed portion 21 formed by a front surface of the bottom plate 22 and inner surfaces of the side wall 23. The recessed portion 21 forms part of the vibration space of the resonator 10.

The vibration space is hermetically sealed by the upper lid 30 and the lower lid 20 that are described above in order to maintain a vacuum state. The vibration space may be filled with, for example, a gas such as an inert gas.

An inner surface of the lower lid 20, that is, a front surface of the bottom plate 22, is formed with a protruding portion 50 (e.g., a protruding member or abutting member) that is protruding inside the vibration space. A detailed configuration of the protruding portion 50 will be described later.

Resonator 10

Figure 3:
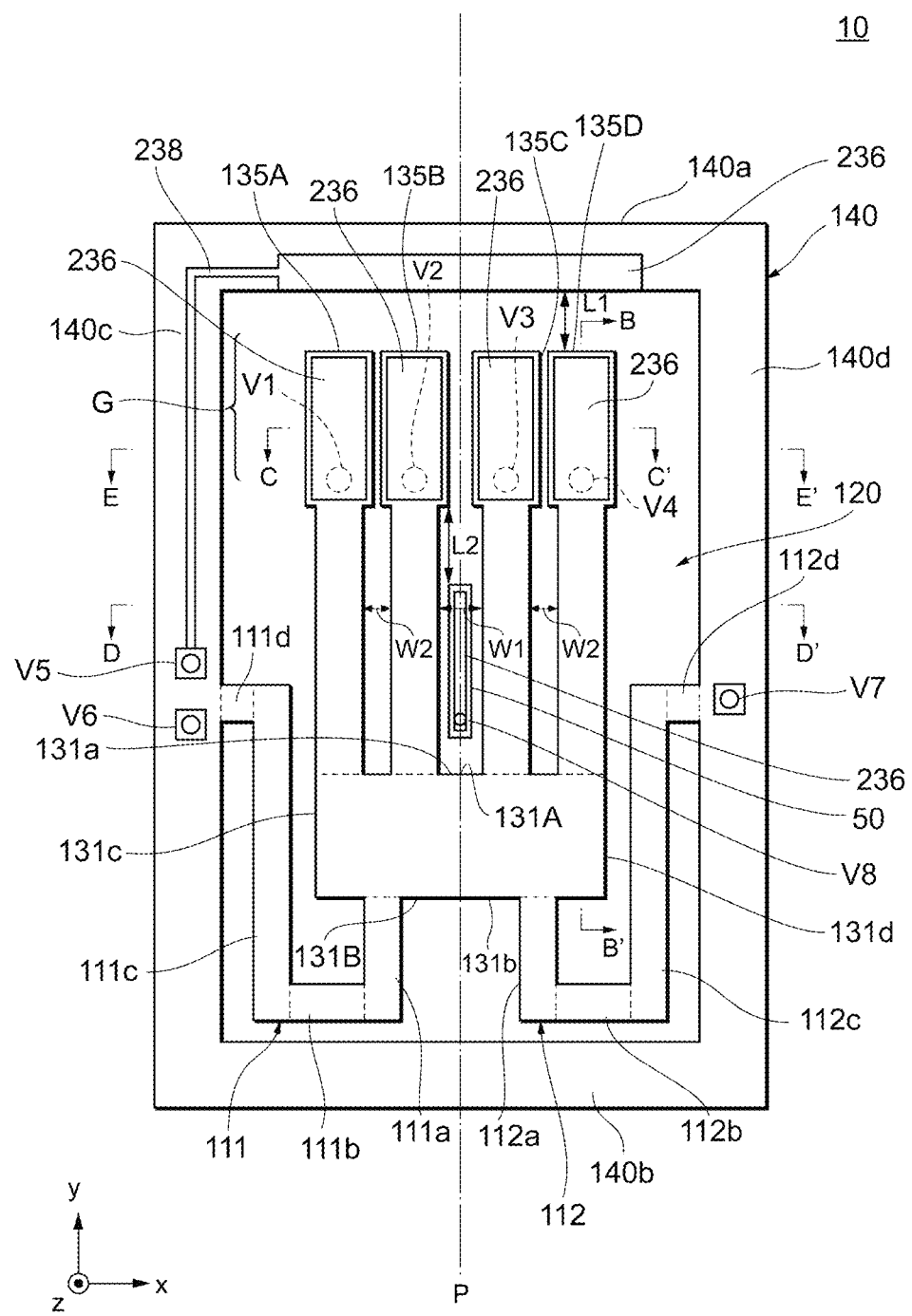
FIG. 3 is a plan view of a resonator according to the first exemplary embodiment with an upper lid removed.

FIG. 3 is a plan view of the resonance device 1 with the upper lid 30 removed. Each configuration of the resonator 10 according to the present embodiment will be described with reference to FIG. 3. The resonator 10 includes a vibration portion 120, a holding portion 140 (generally referred to as a "frame"), holding arms 111 and 112, vias V1, V2, V3, and V4.

Vibration Portion 120

The vibration portion 120 has a comb-tooth shaped outline extending along an XY-plane in an orthogonal coordinate system in FIG. 3. The vibration unit 120 is provided inside the holding portion 140, and a space is formed between the vibration portion 120 and the holding portion 140 at a predetermined interval. In the example in FIG. 3, the vibration portion 120 has a base portion (or simply a "base") 130 and four vibration arms 135A to 135D (also collectively referred to as a "plurality of vibration arms 135"). It is noted that the number of vibration arms is not limited to four, and can be set to an arbitrary number of two or more, for example. In the present embodiment, the plurality of vibration arms 135 and the base portion 130 are integrally formed.

The base portion 130 has long sides 131a and 131b extending along an X-axis direction and short sides 131c and 131d extending along a Y-axis direction, in a plan view. The long side 131a is one side of a surface 131A (hereinafter also referred to as a "front end 131A") of a front end of the base portion 130, and the long side 131b is one side of a surface 131B (hereinafter, also referred to as a "rear end 131B") of a rear end of the base portion 130. In the base portion 130, the front end 131A and the rear end 131B are provided so as to opposite to each other.

The base portion 130 is connected to the plurality of vibration arms 135 at the front end 131A, and connected to the holding arms 111 and 112 at the rear end 131B. It is noted that, in the example illustrated in FIG. 3, the base portion 130 has a substantially rectangular shape in a plan view, but is not limited thereto. Rather, it is sufficient that the base portion 130 is formed so as to be substantially planesymmetric with respect to a virtual plane P defined along a perpendicular bisector of the long side 131a. The base portion 130 may have, for example, a trapezoidal shape in which the long side 131b is shorter than the long side 131a, or a semicircular shape with the long side 131a being a diameter. Further, each of the long sides 131a and 131b and the short sides 131c and 131d is not limited to a straight line, and at least part thereof may be a curve.

In the base portion 130, a base portion length that is a longest distance between the front end 131A and the rear end 131B in a direction from the front end 131A toward the rear end 131B (length of each of the short sides 131c and 131d in FIG. 3) is about 40 µm, for example. In addition, a base portion width that is a longest distance between side ends of the base portion 130 in a width direction orthogonal to a base portion length direction (length of each of the long sides 131a and 131b in FIG. 3) is about 285 μm, for example.

Each one of the plurality of vibration arms 135 extends in the Y-axis direction, and has the same size. Each one of the plurality of vibration arms 135 is provided to be in parallel with the Y-axis direction between the base portion 130 and the holding portion 140, and one end thereof is connected to the front end 131A of the base portion 130 and is a fixed end, and the other end thereof is an open end or a free end. Further, the vibration arms 135 are arranged in parallel at a predetermined interval in the X-axis direction. Note that, each one of the plurality of vibration arms 135 has, for example, a width in the X-axis direction of about 50 μm and a length in the Y-axis direction of about 420 μm.

As further shown, each one of the plurality of vibration arms 135 has a weight portion G at an open end thereof. The weight portion G has a width in the X-axis direction larger than those of the other parts of the plurality of vibration arms 135. For example, the width of the weight portion G in the X-axis direction is about 70 μm. The weight portion G is integrally formed with the other parts of the plurality of vibration arms 135 in the same process. By forming the weight portion G, in the plurality of vibration arms 135, weight per unit length is larger on an open end side than on a fixed end side. Accordingly, each one of the plurality of vibration arms 135 has the weight portion G on the open end side, and thus it is possible to increase amplitude of vibration in an up and down direction in the vibration arm 135.

In the vibration portion 120 according to the present embodiment, two vibration arms, that is, the vibration arms 135A and 135D are disposed on respective outer sides in the X-axis direction, and vibration arms, that is, the vibration arms 135B and 135C are disposed inside. An interval W1 between the inner vibration arms 135B and 135C adjacent to each other in the X-axis direction is set to be larger than an interval W2 between the outer vibration arm 135A (135D) and the inner vibration arm 135B (135C) adjacent to the outer vibration arm 135A (135D) in the X-axis direction. The interval W1 is, for example, about 35 μm, and the interval W2 is about 25 μm, for example. By setting the interval W2 to be smaller than the interval W1, vibration characteristics are improved. Further, in order to reduce the resonance device 1 in size, the interval W1 may be set to be smaller than the interval W2, or to be equal to the interval W2 in alternative aspects.

In addition, a protective film 235 is formed on an entire front surface of the vibration portion 120. A conductive film 236 is also formed on part of a front surface of the protective film 235 in each one of the plurality of vibration arms 135. A resonant frequency of the vibration portion 120 can be adjusted by the protective film 235 and the conductive film 236. It is noted that, the protective film 235 is not necessarily provided over the entire surface of the vibration portion 120, but is desirably provided over the entire surface of the vibration portion 120, in order to protect an underlying electrode film (for example, a metal layer E2 in FIG. 4) and a piezoelectric film (for example, a piezoelectric thin film F3 in FIG. 4) from damage in frequency adjustment.

The conductive film 236 is formed on the protective film 235, such that a front surface thereof is exposed in at least part of a region of the vibration portion 120 in which average displacement due to vibration is larger than that in other regions. Specifically, the conductive film 236 is formed on the protective film 235 at a tip of each one of the plurality of vibration arms 135, that is, in the weight portion G. Meanwhile, the front surface of the protective film 235 is exposed, in regions other than the weight portions G in the plurality of vibration arms 135. In this working example, the conductive film 236 is formed to the tip of each one of the plurality of vibration arms 135, and the protective film 235 is not exposed at a tip portion at all. However, it is noted that the conductive film 236 need not be formed on at least one tip portion of the plurality of vibration arms 135 such that part of the protective film 235 is exposed at least one tip portion of the plurality of vibration arms 135. It is also noted that, a second conductive film may be formed on a base side (side connected to the base portion 130) of each one of the plurality of vibration arms 135, and such a second conductive film is formed on, for example, the protective film 235. In this case, it is possible to suppress a change in temperature characteristics of a frequency involved in frequency adjustment.

Holding Portion 140

The holding portion 140 (or frame) is formed in a rectangular frame shape along the XY-plane. The holding portion 140 is provided so as to surround an outer side portion of the vibration portion 120 along the XY-plane in a plan view. Note that, it is sufficient that the holding portion 140 is provided so as to extend along at least part of a periphery of the vibration portion 120, specifically along the open end side of the plurality of vibration arms 135 when viewed from the base portion 130, and the shape is not limited to a rectangular frame shape. For example, it is sufficient that the holding portion 140 is provided around the vibration portion 120 such that the holding portion 140 holds the vibration portion 120 and can be joined to the upper lid 30 and the lower lid 20.

In the present embodiment, the holding portion 140 is formed of frame bodies 140a to 140d that have a rectangular column shape and are formed integrally. As illustrated in FIG. 3, the frame body 140a is provided so as to face the open end of the plurality of vibration arms 135, such that a longitudinal direction thereof is parallel to the X axis. The frame body 140b is provided so as to face the rear end 131B of the base portion 130, such that a longitudinal direction thereof is parallel to the X-axis. The frame body 140c is provided so as to face the side end (short side 131c) of the base portion 130 and the vibration arm 135A, such that a longitudinal direction thereof is parallel to a Y axis, and both ends thereof are connected to one end of the frame body 140a and one end of the frame body 140b, respectively. The frame body 140d is provided so as to face the side end (short side 131d) of the base portion 130 and the vibration arm 135D, such that a longitudinal direction thereof is parallel to the Y axis, and both ends thereof are connected to the other end of the frame body 140a and the other end of the frame body 140b, respectively.

The protective film 235 is formed on a substantially entire surface of the holding portion 140. Further, in a region in the frame body 140a of the holding portion 140 facing the open end of the plurality of vibration arms 135, the conductive film 236 is provided on the protective film 235. Specifically, the conductive film 236 is formed, in the frame body 140a, along an inner edge in the holding portion 140, from a region facing the vibration arm 135A to a region facing the vibration arm 135D. An inner edge of the conductive film 236 is provided at a position that substantially coincides with the inner edge of the holding portion 140 in a plan view, and an outer edge thereof may be provided so as to be located between the inner edge and the outer edge of the holding portion 140. It is noted that the conductive film 236 of the holding portion 140 is pulled out by a conductive wire 238, and is electrically connected to a via V5 described later.

Holding Arms 111 and 112

The holding arm 111 and the holding arm 112 are disposed inside the holding portion 140, and connect the rear end 131B of the base portion 130 to the frame bodies 140c and 140d. As illustrated in FIG. 3, the holding arm 111 and the holding arm 112 are formed to be substantially plane-symmetric with respect to the virtual plane P defined in parallel with a YZ-plane along a center line of the base portion 130 in the X-axis direction.

The holding arm 111 comprises a plurality of arms 111a, 111b, 111c, and 111d. Moreover, the holding arm 111 has one end connected to the rear end 131B of the base portion 130, and extends therefrom toward the frame body 140b. Then, the holding arm 111 bends in a direction toward the frame body 140c (that is, in the X-axis direction), further bends in a direction toward the frame body 140a (that is, in the Y-axis direction), and bends in the direction toward the frame body 140c (that is, the X-axis direction) again, and the other end is connected to the frame body 140c.

The arm 111a is provided between the base portion 130 and the frame body 140b so as to face the frame body 140c, such that a longitudinal direction thereof is parallel to the Y axis. The arm 111a has one end connected to the base portion 130 at the rear end 131B, and extends substantially perpendicularly to the rear end 131B, that is, extends in the Y-axis direction. An axis passing through a center of the arm 111a in the X-axis direction is desirably provided inside a center line of the vibration arm 135A, and in the example in FIG. 3, the arm 111a is provided between the vibration arms 135A and 135B. Further, the other end of the arm 111a is, on a side surface thereof, connected to one end of the arm 111b. The arm 111a has a width defined in the X-axis direction of about 20 μm, and has a length defined in the Y-axis direction of 40 μm.

The arm 111b is provided between the base portion 130 and the frame body 140b so as to face the frame body 140b, such that a longitudinal direction thereof is parallel to the X-axis direction. One end of the arm 111b is connected to the other end of the arm 111a that is a side surface on a side facing the frame body 140c, and extends therefrom substantially perpendicularly to the arm 111a, that is, extends in the X-axis direction. Further, the other end of the arm 111b is connected to one end of the arm 111c that is a side surface on a side facing the vibration portion 120. For example, the arm 111b has a width defined in the Y-axis direction of about 20 μm, and a length defined in the X-axis direction of about 75 μm.

The arm 111c is provided between the base portion 130 and the frame body 140c so as to face the frame body 140c, such that a longitudinal direction thereof is parallel to the Y-axis direction. The one end of the arm 111c is, on a side surface thereof, connected to the other end of the arm 111b, and the other end thereof is connected to one end of the arm 111d that is a side surface on a side of the frame body 140d. The arm 111c has, for example, a width defined in the X-axis direction of about 20 μm, and a length defined in the Y-axis direction of about 140 μm.

The arm 111d is provided between the base portion 130 and the frame body 140c so as to face the frame body 140a, such that a short direction thereof is parallel to the X-axis direction. The one end of the arm 111d is connected to the other end of the arm 111c that is a side surface on a side facing the frame body 140c. Further, the other end of the arm 111d is connected to the frame body 140c, at a position facing a vicinity of a connecting portion between the vibration arm 135A and the base portion 130, and extends therefrom substantially perpendicularly to the frame body 140c, that is, in the X-axis direction. The arm 111d has a width defined in the Y-axis direction of about 20 μm, and a length defined in the X-axis direction of about 10 μm, for example.

As described above, the holding arm 111 is configured to be connected to the base portion 130 at the arm 111a, to bend at a connecting portion between the arm 111a and the arm 111b, at a connecting portion between the arms 111b and 111c, and at a connecting portion between the arms 111c and 111d, and then to be connected to the holding portion 140.

The holding arm 112 comprises a plurality of arms 112a, 112b, 112c, and 112d. The holding arm 112 has one end connected to the rear end 131B of the base portion 130, and extends therefrom toward the frame body 140b. Then, the holding arm 112 bends in a direction toward the frame body 140d (that is, in the X-axis direction), further bends in the direction toward the frame body 140a (that is, in the Y-axis direction), and bends in the direction toward the frame body 140d (that is, the X-axis direction) again, and the other end is connected to the frame body 140d.

It is noted that since the arms 112a, 112b, 112c, and 112d have a configuration symmetrical to that of the arms 111a, 111b, 111c, and 111d, a detailed description thereof will be omitted.

Vias V1, V2, V3, V4, V5, V6, and V7

Figure 6:
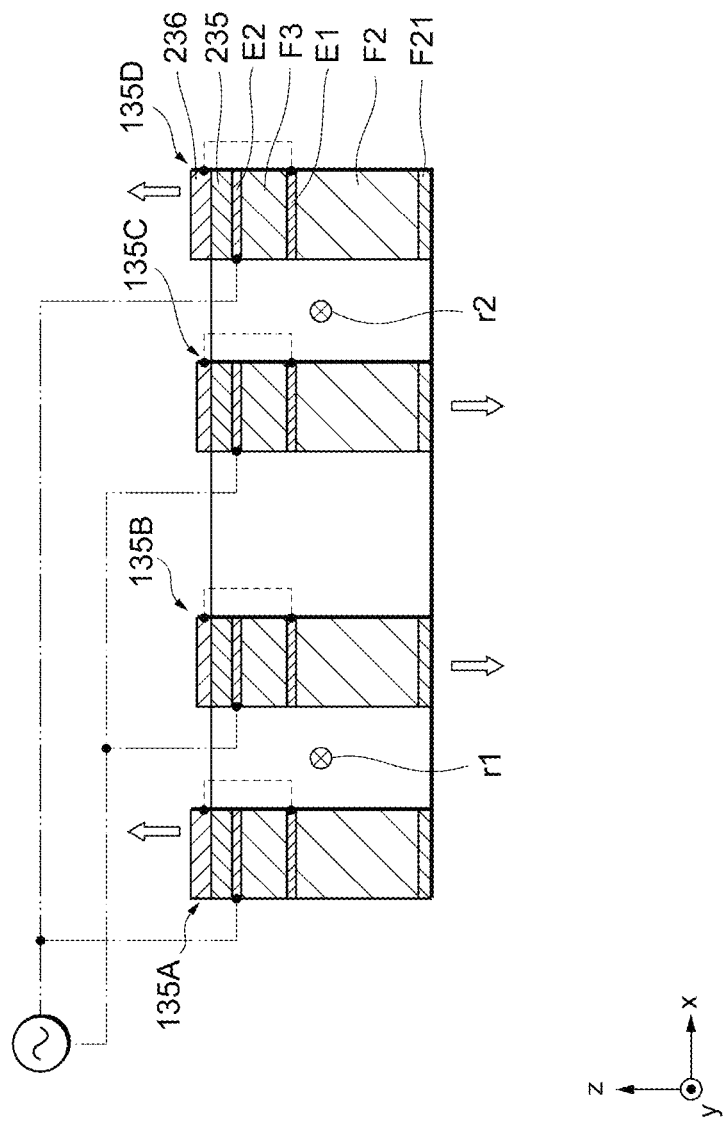
FIG. 6 is a sectional view taken along a line CC' of FIG. 3.

The vias V1, V2, V3, and V4 are holes filled with metal (e.g., a conductor 237 in FIG. 7C) formed in a vicinity of the tip portion of the plurality of vibration arms 135, and electrically connect the conductive films 236 formed on the respective vibration arms 135A to 135D and a metal layer E1 (see FIG. 6), which will be described later, to each other. Thus, it is possible to cancel an electric charge generated on a front surface of each of the vibration arms 135A to 135D. In particular, when the conductive film 236 formed on each of the vibration arms 135A to 135D is grounded through the metal layer E1, an electric charge generated on the front surface of the conductive film 236 of each of the vibration arms 135A to 135D can be canceled. In FIG. 6, two-dot chain lines indicate electrical connections, and particularly dashed lines indicate electrical connections by the vias V1, V2, V3, and V4.

Although details will be described later, the via V1 is formed in a vicinity of a boundary between a region where the conductive film 236 is exposed and a region where the protective film 235 is exposed at a tip portion of the vibration arm 135A, the via V2 is formed in a vicinity of a boundary between a region where the conductive film 236 is exposed and a region where the protective film 235 is exposed at a tip portion of the vibration arm 135B, the via V3 is formed in a vicinity of a boundary between a region where the conductive film 236 is exposed and a region where the protective film 235 is exposed at a tip portion of the vibration arm 135C, the via V4 is formed in a vicinity of a boundary between a region where the conductive film 236 is exposed and a region where the protective film 235 is exposed at a tip portion of the vibration arm 135D. Thus, as shown, in the exemplary embodiment, each via V1 to V4 is formed at an end portion on the fixed end side of the weight portion G.

It is preferable that vias V5, V6, and V7 be formed in a vicinity of a connecting portion with the holding arm 111 or 112 in the holding portion 140. In the example of FIG. 3, the vias V5 and V6 are formed in the vicinity of the connecting portion with the holding arm 111 (i.e., arm 111d) in the frame body 140c, and the via V7 is formed in the vicinity of the connecting portion with the holding arm 112 (i.e., arm 112d) in the frame body 140d. it is noted that the respective positions where the vias V5, V6, and V7 are formed are not limited thereto, and the vias may be formed at arbitrary positions of the holding portion 140.

The via V5 is filled with metal (the conductor 237 in FIG. 4 and FIG. 7C), and electrically connects the metal layer E1 (lower electrode) described later to the conductive wire 238. This makes it possible to cancel an electric charge generated in a region in the holding portion 140 facing the plurality of vibration arms 135. In particular, when the conductive film 236 of the frame body 140a is grounded through the metal layer E1, an electric charge generated on a front surface of the holding portion 140 can be further canceled. Further, the conductive film 236 of the plurality of vibration arms 135 and the conductive film 236 of the frame body 140a can be made to have the same potential when electrically connected to each other through the metal layer E1. Accordingly, Coulomb force generated between the plurality of vibration arms 135 and the frame body 140a can be reduced, and fluctuation of a resonant frequency can be suppressed.

A terminal for electrically connecting the metal layer E2 (i.e., an upper electrode) described later to an external driving power supply, is formed in each of the via V6 and the via V7. Accordingly, a driving power supply is given to the vibration portion 120.

Protruding Portion 50

The protruding portion 50 is formed on the lower lid 20 so as to protrude between the vibration arm 135B and the vibration arm 135C adjacent to each other. In the present embodiment, the protruding portion 50 is formed in a rectangular column shape extending in parallel with the vibration arms 135B and 135C. In an exemplary aspect, the length of the protruding portion 50 in a direction along the vibration arms 135B and 135C is about 240 μm, and a length (width) perpendicular to the direction is about 15 μm. By forming the protruding portion 50 on the lower lid 20, it is possible to suppress occurrence of warpage of the lower lid 20, even when the thickness of the lower lid 20 is reduced, for example, in order to thin the resonance device 1. In FIG. 3, as an example, the example is illustrated in which, the weight portions G of the respective vibration arms 135B and 135C and the protruding portion 50 face each other in the Y-axis direction, that is, have an overlapping region in the X-axis direction (direction orthogonal to an extending direction of the plurality of vibration arms 135), but the present invention is not limited to this aspect.

The conductive film 236 is exposed on a front surface of the protruding portion 50. Although not illustrated in FIG. 3, the protruding portion 50 is formed with the protective film 235, and the conductive film 236 is formed on a front surface of the protective film 235.

Further, it is preferable that a via V8 be formed in an end portion of the protruding portion 50 on a side of the frame body 140b. The via V8 is filled with metal (the conductor 237 in FIG. 7C), and electrically connects the metal layer E1 (i.e., lower electrode) described later to the conductive film 236 formed on the protruding portion 50. This makes it possible to cancel an electric charge generated on the front surface of the protruding portion 50. In particular, when the conductive film 236 formed on the protruding portion 50 is grounded through the metal layer E1, an electric charge generated on the front surface of the protruding portion 50 can be further canceled. Further, the conductive film 236 of the plurality of vibration arms 135 and the conductive film 236 of the protruding portion 50 can be made to have the same potential when electrically connected to each other through the metal layer E1. Accordingly, Coulomb force generated between the plurality of vibration arms 135 and the protruding portion 50 can be reduced, and fluctuation of a resonant frequency can be suppressed. However, an electric charge generated on a side surface of the protective film 235 formed under the conductive film 236 of the protruding portion 50 cannot be canceled through the conductive film 236. Similarly, an electric charge generated on the side surfaces of the protective film 235 formed under the conductive film 236 of the plurality of vibration arms 135 and the holding portion 140 (e.g., frame body 140a) cannot be canceled through the conductive film 236. As described above, there is a possibility that an electric charge generated on a side surface of an insulating film such as the protective film 235 or the piezoelectric thin film F3 may fluctuate a resonant frequency of the resonator 10.

Here, in FIG. 3 (that is, when a surface of the lower lid 20 facing the resonator 10 is viewed in a plan view), a distance between the weight portion G of any one of the vibration arm 135B and the vibration arm 135C, and the holding portion 140 (e.g., the frame body 140a) is defined as a distance L1, and a distance between the weight portion G and the protruding portion 50 is defined as a distance L2. More specifically, the distance L2 refers to a distance between the protruding portion 50 and the weight portion G, in the extending direction of the plurality of vibration arms 135 (i.e., Y-axis direction), when the surface of the lower lid 20 facing the resonator 10 is viewed in plan. More specifically, the distance L2 refers to a distance in the Y-axis direction, between an end portion closest to the weight portion G of the protruding portion 50, and an end portion closest to the protruding portion 50 of the weight portion G. In addition, the distance L1 refers to, more specifically, a distance between the weight portions G of any one of the vibration arms 135B and vibration arm 135C and the holding portion 140, in the extending direction of the plurality of vibration arms 135 (Y-axis direction), when the surface of the lower lid 20 facing the resonator 10 is viewed in plan. More specifically, the distance L1 refers to a distance in the Y-axis direction, between an end portion closest to the frame body 140a of the weight portion G, and an end portion closest to the weight portion G of the frame body 140a. At this time, the distance L2 is set to be longer than the distance L1, and is more preferably set to be two times or more. For example, the distance L2 is 20 μm or more. According to this configuration, it is possible to reduce deterioration in characteristics due to Coulomb force between the weight portion G and the protruding portion 50. According to this, it is possible to suppress deterioration in vibration characteristics of the resonator 10 caused by an electric charge generated on the respective side surfaces of the plurality of vibration arms 135, the protruding portion 50, and the frame body 140a. Further, even when the conductive film 235 is not electrically connected to the metal layer E1 or the metal layer E2, and thus an electric charge on a front surface of the conductive film 235 is not canceled, deterioration in the vibration characteristics of the resonator 10 can be reduced. Further, even when the respective conductive films 235 of the protruding portion 50 and the frame 140a are omitted, and electric charges generated on respective front surfaces of the protruding portion 50 and the frame body 140a are not canceled, deterioration in the vibration characteristics of the resonator 10 can be reduced.

Laminated Structure

Figure 4:
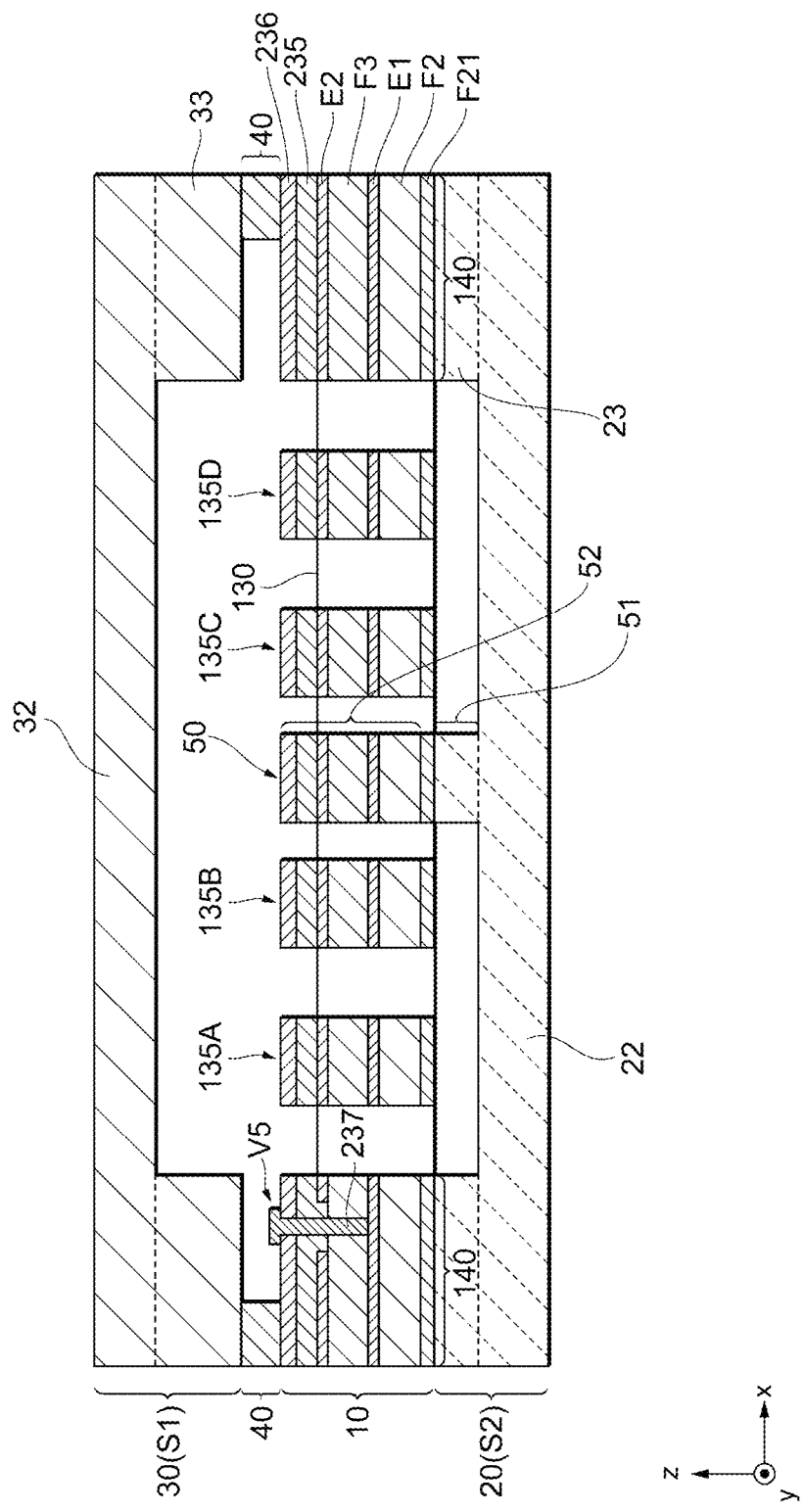
FIG. 4 is a sectional view taken along a line AA' of FIG. 2.

A laminated structure of the resonator 10 will be described with reference to FIG. 4. FIG. 4 is an AA' sectional view of FIG. 2. The AA' section is a section that is parallel to the frame body 140b, and that passes through the via V5.

Laminated Structure of Upper Lid

The upper lid 30 is formed of an Si (silicon) wafer S1 having a predetermined thickness. As illustrated in FIG. 4, the upper lid 30, at a back surface on a peripheral portion (i.e., side wall 33) thereof, is joined to the holding portion 140 of the resonator 10 by a joint layer 40 described later. The back surface of the upper lid 30 is preferably covered with a silicon oxide film (not illustrated). The silicon oxide film may be, for example, formed on a surface of the Si wafer S1, by oxidation of the surface of the Si wafer S1, or chemical vapor deposition (CVD).

It is noted that although not illustrated in FIG. 4, a terminal is formed on a front surface of the upper lid 30. The terminal is formed by filling a conductive material, such as impurity-doped polycrystalline silicon (Poly-Si), Cu (copper), Au (gold), or impurity-doped single crystal silicon into a through-hole formed in the upper lid 30. The terminal is electrically connected to the vias V6 and V7, and functions as a wiring line for electrically connecting an external power supply to the resonator 10. The terminal may be formed on a back surface of the lower lid 20, or on a side surface of the upper lid 30 or the lower lid 20.

Laminated Structure of Lower Lid

The bottom plate 22 and the side wall 23 of the lower lid 20 are integrally formed of an Si (silicon) wafer S2. Further, the lower lid 20 is joined to the holding portion 140 of the resonator 10, by a front surface of the side wall 23. The thickness of the lower lid 20 defined in a Z-axis direction is, for example, 150 μm, and the depth of the recessed portion 21 is, for example, 50 μm. It is noted that the Si wafer S2 is formed of non-degenerate silicon, and resistivity thereof is, for example, 16 mΩ·cm or more.

Laminated Structure of Resonator

In the resonator 10, the holding portion 140, the base portion 130, the plurality of vibration arms 135, the holding arm 111 and 112 are integrally formed by the same process. In the resonator 10, first, the metal layer E1 (an example of a lower electrode) is laminated on an Si (silicon) substrate F2. Then, the piezoelectric thin film F3 (an example of a piezoelectric film) is laminated on the metal layer E1 so as to cover the metal layer E1, and the metal layer E2 (an example of an upper electrode) is laminated on a front surface of the piezoelectric thin film F3. That is, the metal layer E1 and the metal layer E2 are provided so as to face each other with the piezoelectric thin film F3 interposed therebetween, the lower lid 20 is provided so as to face the metal layer E1, and the upper lid 30 is provided so as to face the metal layer E2. On the metal layer E2, the protective film 235 is laminated so as to cover the metal layer E2. In the weight portion G of each one of the plurality of vibration arms 135, the conductive film 236 is further laminated on the protective film 235. In the present working example, the metal layer E2 is configured not to extend to the tip of the plurality of vibration arms 135. Accordingly, it is possible to suppress a change in characteristics due to a short circuit with the metal layer E1 or the conductive film 236. As described above, it is desirable to pattern the metal layer E2 so as not to extend to the tip of the plurality of vibration arms 135, but the metal layer E2 may be extended to the tip. It is noted that, when a degenerate silicon substrate with low resistance is used as the Si substrate F2, since the Si substrate F2 itself also functions as the lower electrode, the metal layer E1 may also be omitted.

The Si substrate F2 is formed of, for example, a degenerate n-type Si semiconductor having a thickness of about 6 μm, and may contain P (phosphorus), As (arsenic), Sb (antimony), or the like as an n-type dopant. Further, the resistance value of degenerate Si used for the Si substrate F2 is, for example, less than 1.6 mΩ·cm, and is more preferably 1.2 mΩ·cm or less. Further, a temperature characteristic correction layer made of a silicon oxide (e.g., $SiO_2$) layer F21 is formed on a lower surface of the Si substrate F2. This makes it possible to improve temperature characteristics.

In the present embodiment, the temperature characteristic correction layer refers to a layer having a function of reducing a temperature coefficient (that is, a rate of change per temperature) of a frequency in the vibration portion, at least near room temperature. The vibration portion 120 has the silicon oxide layer F21 corresponding to the temperature characteristic correction layer, and thus, for example, it is possible to reduce a change in association with the temperature in a resonant frequency of a laminated structure of the Si substrate F2, the metal layers E1, E2, the piezoelectric thin film F3, and the silicon oxide layer F21.

In the resonator 10, it is desirable that the silicon oxide layer F21 is formed to have a uniform thickness. For purposes of this disclosure, it is noted that the uniform thickness means that a variation in the thickness of the silicon oxide layer F21 is within ±20% from an average value of the thickness.

It is also noted that the silicon oxide layer F21 may be formed on the upper surface of the Si substrate F2, or may be formed on both the upper surface and the lower surface of the Si substrate F2. In addition, in the holding portion 140, the silicon oxide layer F21 need not be formed on the lower surface of the Si substrate F2.

The metal layers E2 and E1 are formed using, for example, Mo (molybdenum), aluminum (Al), or the like having a thickness of about 0.1 μm to 0.2 μm. Each of the metal layers E2 and E1 is formed in a desired shape by etching or the like. The metal layer E1 is formed so as to function as a lower electrode, a float electrode, or a ground electrode in the vibration portion 120, for example. In the present working example, the metal layer E1 functions as a lower electrode. Further, the metal layer E1 is formed in the holding arms 111 and 112 or the holding portion 140, so as to function as a lower wiring line for electrically connecting a lower electrode to an AC power supply provided outside the resonator 10, or a lower wiring line for electrically connecting a ground electrode to a ground.

On the other hand, the metal layer E2 is formed so as to function as an upper electrode in the vibration portion 120. Additionally, the metal layer E2 is formed in the holding arms 111 and 112 or the holding portion 140, so as to function as an upper wiring line for electrically connecting an upper electrode to a circuit or an AC power supply provided outside the resonator 10.

Note that, as for electrical connection from an external AC power supply or the ground to a lower wiring line, a configuration in which an extended electrode is formed at a joint portion between the upper lid 30 and the resonator 10, and the extended electrode electrically connects an inside to an outside of the resonance device 1, or a configuration in which a via is formed in the upper lid 30, a via wiring line is provided by filling an inside of the via with a conductive material, and the via wiring line electrically connects the inside to the outside of the resonance device 1 may be used. The electrical connection using such an extended electrode or a via electrode can be similarly applied to electrical connection from an external circuit or AC power supply to an upper wiring line. Note that, the respective functions of the metal layer E1 and the metal layer E2 may be interchanged with each other. That is, the metal layer E2 (i.e., upper electrode) may be electrically connected to an external AC power supply or the ground, and the metal layer E1 (i.e., lower electrode) may be electrically connected to an external circuit.

According to an exemplary aspect, the piezoelectric thin film F3 is a thin film of a piezoelectric body that converts an applied voltage into vibration, and for example, may contain nitride such as AlN (aluminum nitride) or oxide as a main component. More specifically, the piezoelectric thin film F3 may be formed of ScAlN (scandium aluminum nitride). ScAlN is obtained by substituting part of aluminum in aluminum nitride with scandium. Further, the piezoelectric thin film F3 has a thickness of, for example, 1 μm, but the piezoelectric thin film F3 having the thickness of about 0.2 μm to about 2 μm may be used.

The piezoelectric thin film F3 expands and contracts in an in-plane direction in the XY-plane, that is, in the Y-axis direction, in accordance with an electric field applied to the piezoelectric thin film F3 by the metal layers E2 and E1. Due to the expansion and contraction of the piezoelectric thin film F3, the plurality of vibration arms 135 displaces the open end thereof toward the inner surface of the lower lid 20 and an inner surface of the upper lid 30, and vibrates in an out-of-plane bending vibration mode. Note that, in the present embodiment, a configuration is adopted in which, in the out-of-plane bending vibration mode of four arms, upper electrodes are divided and are connected to AC power sources respectively, thus two inner arms and two outer arms are bent and vibrated in respective directions opposed to each other, however, the present invention is not limited thereto. For example, a configuration including one vibration arm, or a configuration in which a vibration arm vibrates in an in-plane bending vibration mode may be used.

The protective film 235 is a layer of an insulator, and is formed of a material for which a rate of mass reduction by etching is smaller than that of the conductive film 236. For example, the protective film 235 is formed of a nitride film such as AlN or SiN, or an oxide film such as $Ta_2O_5$ (tantalum pentoxide) or $SiO_2$. Note that, the rate of mass reduction is expressed by a product of an etching rate (thickness to be removed per unit time) and a density. The thickness of the protective film 235 is formed to be half a thickness (C-axis direction) of the piezoelectric thin film F3 or less, and in the present embodiment, the thickness is, for example, about 0.2 μm. Note that, a more preferable thickness of the protective film 235 is about one-fourth of the thickness of the piezoelectric thin film F3. Further, when the protective film 235 is formed of a piezoelectric body such as AlN, it is preferable to use a piezoelectric body having the same orientation as that of the piezoelectric thin film F3.

The conductive film 236 is a layer of a conductor, and is formed of a material for which a rate of mass reduction by etching is larger than that for the protective film 235. The conductive film 236 is formed of, for example, metal such as molybdenum (Mo), tungsten (W), gold (Au), platinum (Pt), nickel (Ni), aluminum (Al), or titanium (Ti).

It is noted that, as far as the relationship for the rate of mass reduction is as described above, the magnitude relationship for an etching rate between the protective film 235 and the conductive film 236 is desirably determined.

The conductive film 236 is formed on a substantially entire surface of the vibration portion 120, and then formed only in a predetermined region by processing such as etching.

In the resonance device 1 according to the present embodiment, after the resonator 10 as described above is formed, a trimming step for adjusting a film thickness of the conductive film 236 is performed.

In the trimming step, first, the resonant frequency of the resonator 10 is measured, and a deviation with respect to a target frequency is calculated. Next, the film thickness of the conductive film 236 is adjusted based on the calculated frequency deviation. The film thickness of the conductive film 236 can be adjusted by, for example, irradiating an entire surface of the resonance device 1 with an argon (Ar) ion beam, and etching the conductive film 236. A range wider than the resonator 10 can be irradiated with the ion beam. It should be appreciated that, although an example in which etching is performed by an ion beam is illustrated in the present embodiment, the etching method is not limited to one using the ion beam. Further, after the film thickness of the conductive film 236 is adjusted, it is desirable to clean the resonator 10 and remove scattered films.

The via V5 is formed by filling a hole obtained by removing a part of the conductive film 236, the protective film 235, the metal layer E2, and the piezoelectric thin film F3, with the conductor 237 such that a front surface of the metal layer E1 is exposed. The conductor 237 filled in the via V5 is, for example, Mo (molybdenum), aluminum (Al), or the like. The conductive film 236 and the metal layer E1 formed in the frame body 140a of the holding portion 140 are electrically connected to each other through the conductor 237 filled in the via V5.

Figure 5:
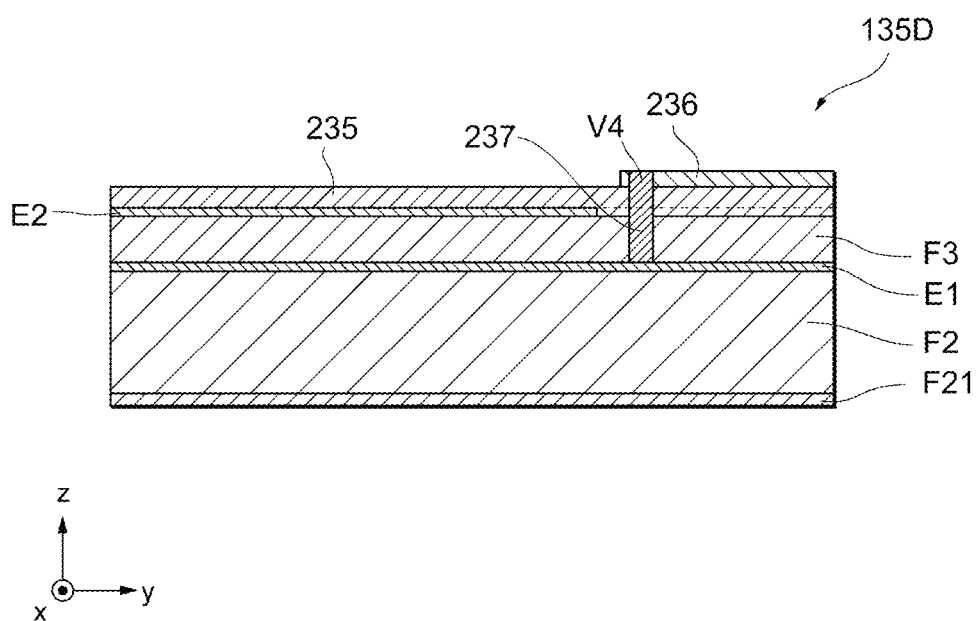
FIG. 5 is a sectional view taken along a line BB' of FIG. 3.

FIG. 5 is a schematic view of a section when the vibration arm 135D is cut along the line BB' of FIG. 3. As illustrated in FIG. 5, the metal layer E2 is formed such that an area thereof is adjusted, in order to decrease a region overlapping with the conductive film 236 as much as possible.

The via V4 is formed by filling a hole obtained by removing part of the conductive film 236, the protective film 235, the metal layer E2, and the piezoelectric thin film F3, with the conductor 237 such that a front surface of the metal layer E1 is exposed. The conductor 237 filled in the via V4 is, for example, Mo (molybdenum), aluminum (Al), or the like. The conductive film 236 and the metal layer E1 are electrically connected to each other through the conductor 237 filled in the via V4. Accordingly, an electric charge in the protective film 235 can be moved to the metal layer E1. The electric charge moved to the metal layer E1 can be released outside the resonance device 1, via a connection terminal with an outside, connected to the metal layer E1. As described above, in the resonator 10 according to the present embodiment, it is possible to suppress the protective film 235 formed in the vibration portion 120 from being charged, thereby preventing fluctuation in the resonant frequency due to an electric charge in the vibration portion 120.

Here, when the metal layer E1 and the conductive film 236 are electrically connected to each other, electric fields in opposite directions are applied to the protective film 235 and the piezoelectric thin film F3. For this reason, when a region where the metal layer E2 and the conductive film 236 overlap with each other is large, vibration of the resonator 10 is hindered. According to the resonator 10 according to the present embodiment, the region where the metal layer E2 and the conductive film 236 overlap with each other is set to be as small as possible. Thereby, it is possible to prevent vibration of the piezoelectric thin film F3 from being hindered by the electric field applied to the protective film 235. It is noted that, a connection mode, a material, an effect, and the like of each of the vias V1, V2, and V3, are similar to those of the via V4, thus description thereof will be omitted.

FIG. 6 is a schematic view of a section when the resonator 10 is cut along the line CC' in FIG. 3. In the present embodiment, a phase of an electric field applied to the outer vibration arms 135A and 135D, and a phase of an electric field applied to the inner vibration arms 135B and 135C are set to be opposite to each other. Accordingly, the outer vibration arms 135A and 135D, and the inner vibration arms 135B and 135C are displaced in respective directions opposite to each other. For example, when the outer vibration arms 135A and 135D displace respective open ends toward the inner surface of the upper lid 30, the inner vibration arms 135B and 135C displace respective open ends toward the inner surface of the lower lid 20.

Accordingly, in the resonator 10 according to the present embodiment, during opposite phase vibration, that is, the vibration arm 135A and the vibration arm 135B vibrate in respective directions vertically opposite to each other around a central axis r1 extending in parallel with a Y axis between the vibration arm 135A and the vibration arm 135B illustrated in FIG. 6. Further, the vibration arm 135C and the vibration arm 135D vibrate in respective directions vertically opposite to each other around a central axis r2 extending in parallel with the Y axis between the vibration arm 135C and the vibration arm 135D. Accordingly, torsional moments in directions opposite to each other are generated at the center axes r1 and r2, respectively, and bending vibration is generated in the base portion 130.

Laminated Structure of Protruding Portion

Referring back to FIG. 4, the description of the laminated structure of the resonance device 1 continues. In particular, the protruding portion 50 has a first layer 51 formed integrally with the Si wafer S2 of the lower lid 20, and a second layer 52 formed with the resonator 10 in the same process. The second layer 52 is formed by laminating the silicon oxide layer F21, the Si substrate F2, the metal layer E1, the piezoelectric thin film F3, the metal layer E2, the protective film 235, and the conductive film 236 in this order.

Laminated Structure of Joint Layer 40

The joint layer 40 is formed between the periphery of the upper lid 30 and the holding portion 140, and the upper lid 30 is joined to the holding portion 140 by a joint layer 40. The joint layer 40 is formed of, for example, an Au (gold) film and an Sn (tin) film.

Process Flow

Figure 7A:
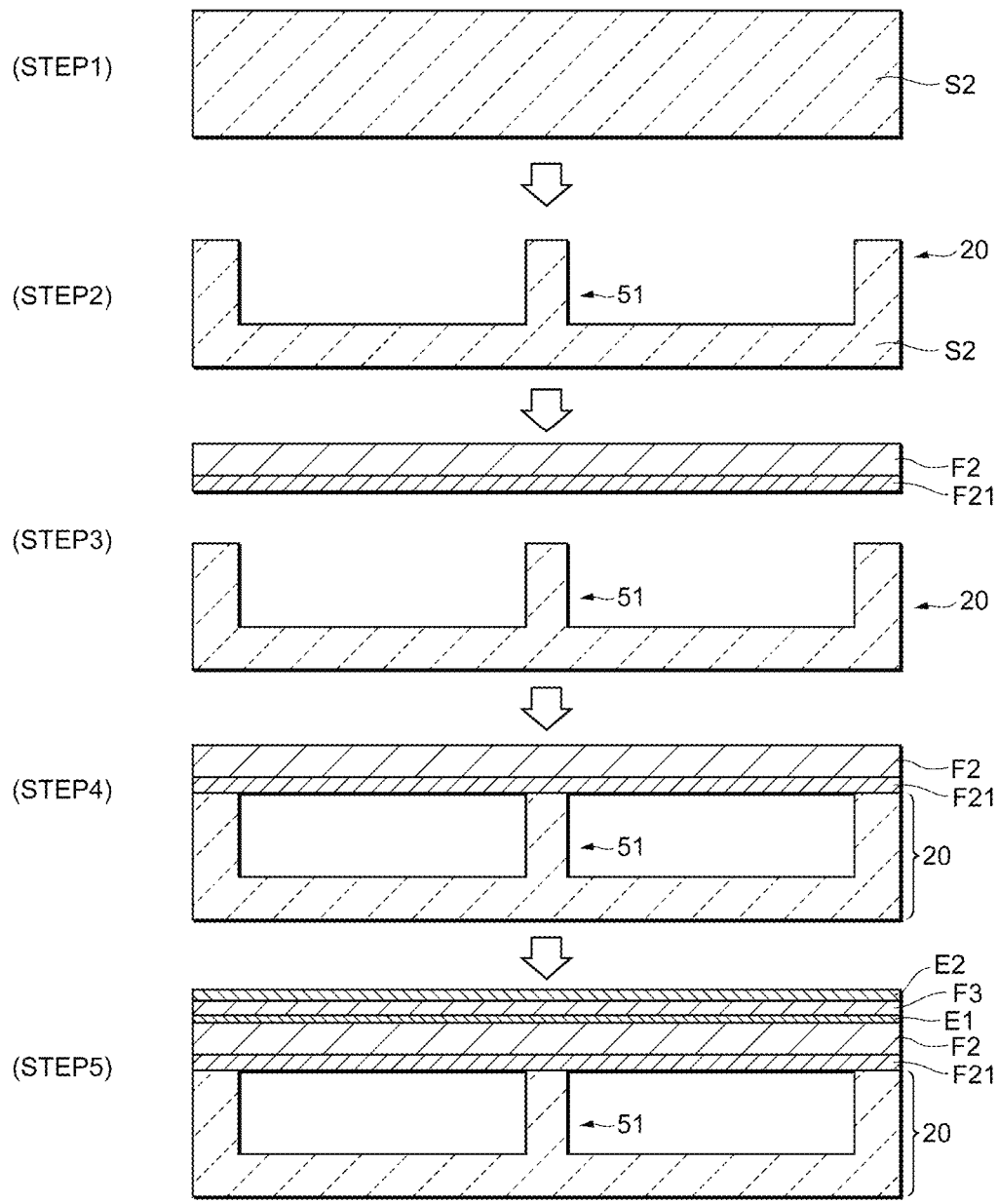
FIG. 7A is a diagram illustrating an example of a process flow of the resonance device according to the first exemplary embodiment.
Figure 7C:
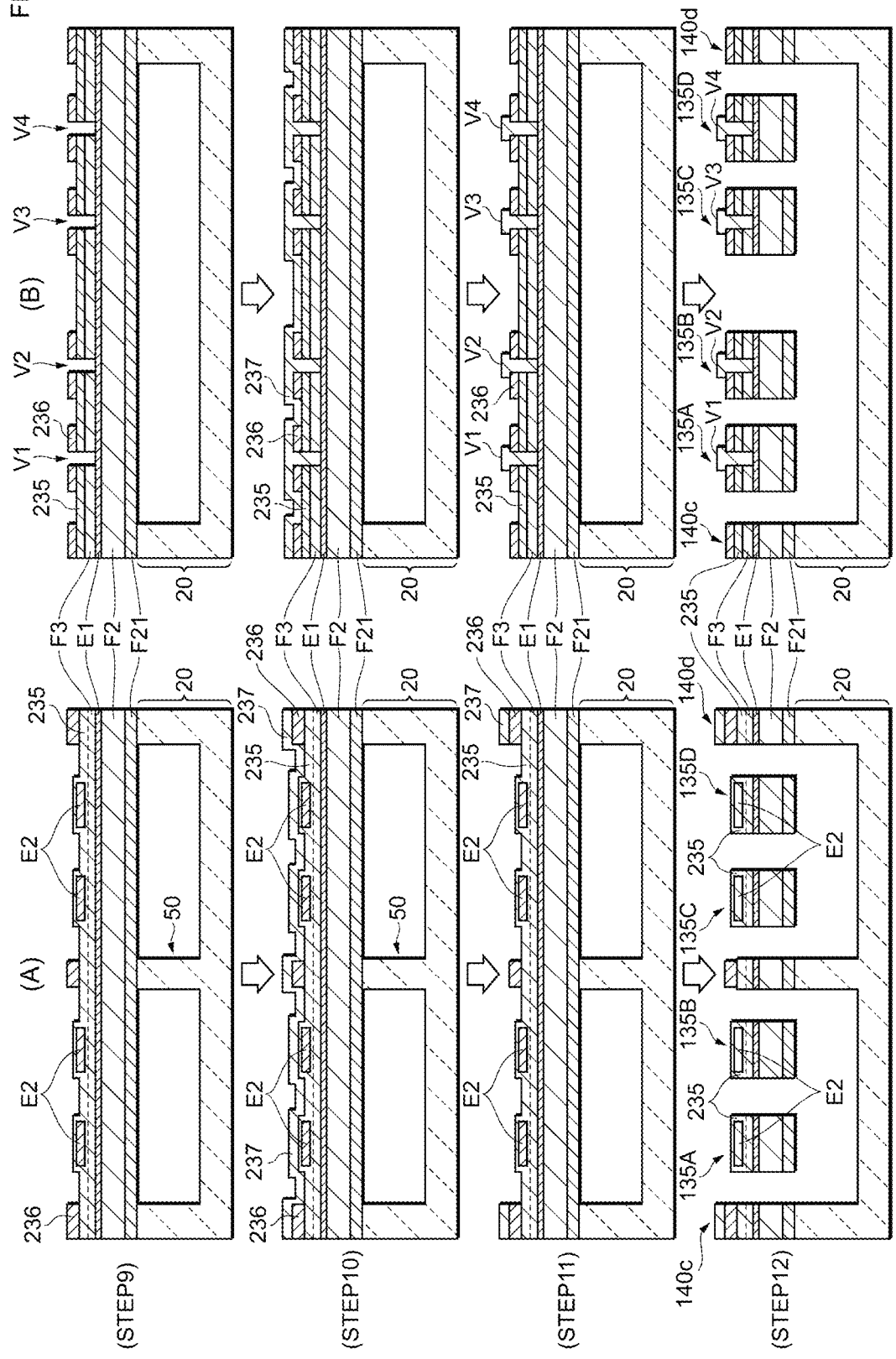
FIG. 7C is a diagram illustrating the example of the process flow of the resonance device according to the first exemplary embodiment.

Next, a process flow of the resonance device 1 will be described with reference to FIG. 7A to FIG. 7C. FIG. 7A is a process flow of a DD' section of FIG. 3.

First, in a first step, a handle Si (the Si wafer S2) to be the lower lid 20 is prepared (STEP 1). Next, a cavity is formed by etching in the handle Si, and the lower lid 20 and the first layer 51 of the protruding portion 50 are formed (STEP 2), and are thermally joined to a SOI substrate (the Si substrate F2 formed with the silicon oxide layer F21) separately prepared in STEP 3 (STEP 4). Next, the metal layer E1, the piezoelectric thin film F3, and the metal layer E2 are formed on the SOI substrate in this order (STEP 5). Note that, a seed layer may be formed between the metal layer E1 and the Si substrate F2. The seed layer is, for example, an aluminum nitride layer or the like. In this case, it is possible to improve crystallinity of the piezoelectric thin film F3 formed on the metal layer E1.

Next, the following steps will be described with reference to FIG. 7B and FIG. 7C. Each of FIG. 7B-Part(A) and FIG. 7C-Part(A) is a process flow of the DD' section of FIG. 3, similarly to FIG. 7A. On the other hand, each of FIG. 7B-Part(B) and FIG. 7C-Part(B) is a process flow of an EE' section of FIG. 3.

In STEP 6 subsequent to STEP 5 described above, the metal layer E2 is patterned by etching or the like, to form an upper electrode (STEP 6). Note that, when the metal layer E1, the piezoelectric thin film F3, and the metal layer E2 are formed in STEP 5, the metal layer E1 and the piezoelectric thin film F3 may be patterned. Next, the protective film 235 and the conductive film 236 are formed in this order (STEP 7 and STEP 8).

In the subsequent step, the vias V1 to V5 are formed (STEP 9). Specifically, the conductive film 236, the protective film 235, the metal layer E2, and the piezoelectric thin film F3 are removed so that the metal layer E1 is exposed in respective regions where the vias V1 to V5 are formed. Next, the conductor 237 is laminated, to fill the vias V1 to V5 with the conductor 237 (STEP 10). The conductor 237 is patterned so as to cover respective openings of the vias V1 to V5 (STEP 11).

Further, in order to form an outer shape of the vibration portion 120, the plurality of vibration arms 135 are released from each other, and the plurality of vibration arms 135 and the holding portion 140 are released from each other by etching or the like (STEP 12). Then, the separately prepared upper lid 30 is joined to form the resonance device 1.

Effect

Figure 8:
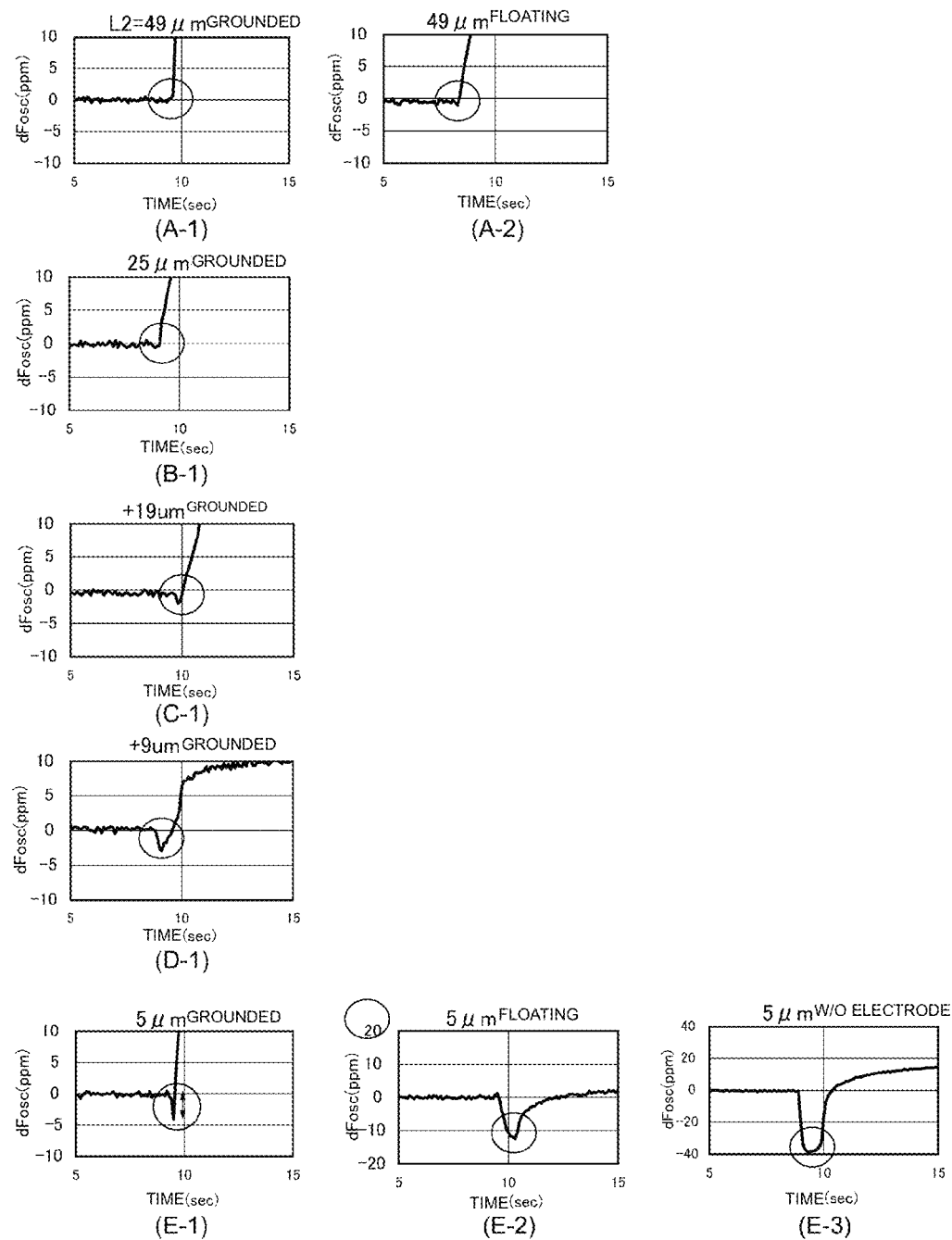
FIG. 8 includes graphs each illustrating a result of verifying an effect of the resonance device according to the first exemplary embodiment.
Figure 9:
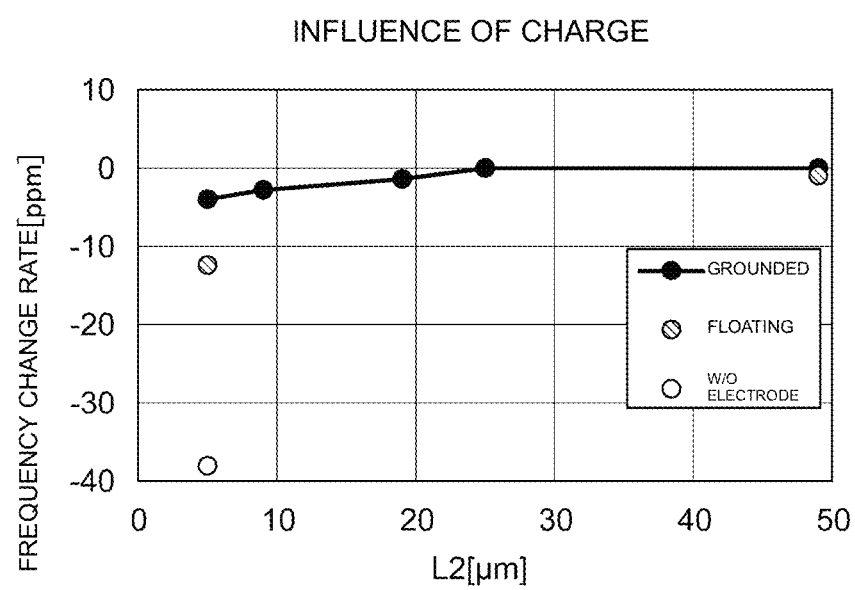
FIG. 9 is a graph illustrating the result of verifying the effects of the resonance device according to the first exemplary embodiment.

Referring to FIG. 8 and FIG. 9, an effect obtained by setting the distance L2 from the protruding portion 50 to the weight portion G to be larger than the distance L1 from the open end of the plurality of vibration arms 135 to the holding portion 140 will be described.

FIG. 8 and FIG. 9 are graphs illustrating verification results of influence of a length of the distance L2 with respect to the distance L1 on frequency fluctuation due to an electric charge in the protective film 235.

In the verification for which the results are illustrated in FIG. 8, the distance L1 is fixed to 10 μm, and the distance L2 is varied from 49 μm (A-1, A-2), 25 μm (B-1), 19 μm (C-1), 9 μm (D-1), to 5 μm (E-1, E-2, E-3) for each sample of the resonance device. In the respective samples of A-1, B-1, C-1, D-1, and E-1, the conductive film 236 formed in the protruding portion 50 is grounded. In the respective samples of A-2 and E-2, the conductive film 236 formed in the protruding portion 50 is brought into a floating state. Further, in the sample of E-3, the conductive film 236 is not formed in the protruding portion 50. The remaining configuration in each the sample is as described above.

The graphs of FIG. 8 each illustrate a change in frequency when trimming is performed by irradiating the sample with an ion beam for about 1.0 second. An Ar ion beam is used for the verification in FIG. 7. Further, frequency measurement was performed by a vibration circuit and a frequency counter.

When the resonator is irradiated with the ion beam, and the conductive film 236 is etched, the frequency increases. However, when the frequency is affected by an electric charge, the frequency temporarily decreases immediately after the irradiation with the ion beam. Here, referring to the graphs of FIG. 8, when the distance L2 is 5 μm (E-1, E-2, and E-3), it can be seen that in any of cases where the conductive film 236 of the protruding portion 50 is in a grounded state, in a floating state, and the protruding portion 50 does not have the conductive film 236, the frequency decreases immediately after the ion beam irradiation, and is affected by the charge.

Next, when the length of the distance L2 is 9 μm (D-1), it can be seen that even when the conductive film 236 of the protruding portion 50 is grounded, the frequency decreases immediately after the ion beam irradiation, and is affected by the charge.

On the other hand, when the length of the distance L2 is 19 μm or more (A-1, A-2, B-1, and C-1), it can be seen that the decrease in frequency immediately after the ion beam irradiation is moderated, and influence of the charge is reduced.

FIG. 9 is a graph illustrating the verification results in FIG. 8 with the length of the distance L2 illustrated in a horizontal axis, and frequency change rate illustrated in a vertical axis. As is obvious from FIG. 9, when the distance L2 is larger than 10 µm, that is, larger than the distance L1, the frequency change rate is reduced. Further, when the distance L2 is 20 µm or more, that is, twice the distance L1 or more, this tendency is remarkable.

As described above, in the resonance device 1 according to the present embodiment, the distance L2 between the protruding portion 50 and a rear end of the weight portion G is set to be larger than the distance L1 from the open end of the plurality of vibration arms 135 to the region in the holding portion 140 facing the open end. More preferably, the distance L2 is a length twice the distance L1 or more, and the length of the distance L2 is 20 µm, for example. This makes it possible to reduce the influence of Coulomb force due to an electric charge in the protective film 235 on frequency fluctuation of the resonator 10.

Second Exemplary Embodiment

In a second and subsequent embodiments, it is noted that descriptions of matters common to the first embodiment will be omitted, and only different points will be described. In particular, similar actions and effects according to a similar configuration will not be described in detail for each embodiment.

Figure 10:
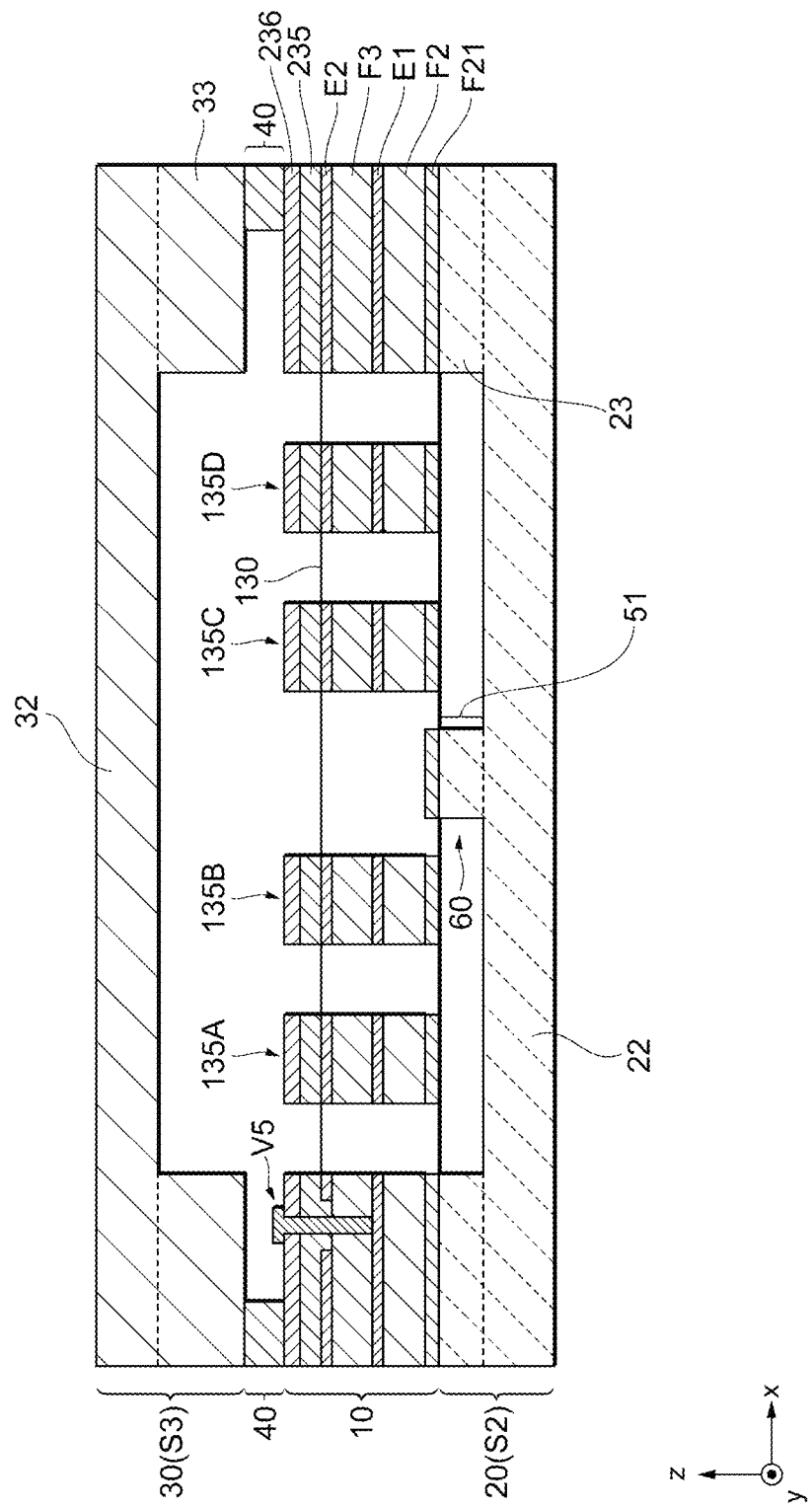
FIG. 10 is a plan view of a resonator according to a second exemplary embodiment.

FIG. 10 corresponds to FIG. 4 and is the AA' sectional view of a resonance device 2 according to the present embodiment. The resonance device 2 has a protruding portion 60 instead of the protruding portion 50 in the resonance device 1. The protruding portion 60 is formed of the first layer 51 in the protruding portion 50, but does not have the second layer 52 as described above with respect to the first exemplary embodiment. It is noted that other configurations of the protruding portion 60 is similar to that of the protruding portion 50.

Other configurations and functions of the resonance device 2 are similar to those of the resonance device 1. Similarly, each of the semiconductor layer, the lower electrode, the piezoelectric film, the upper electrode, the insulating film, and the conductive film on the first layer 51 may be present or absent as necessary.

Third Exemplary Embodiment

Figure 11:
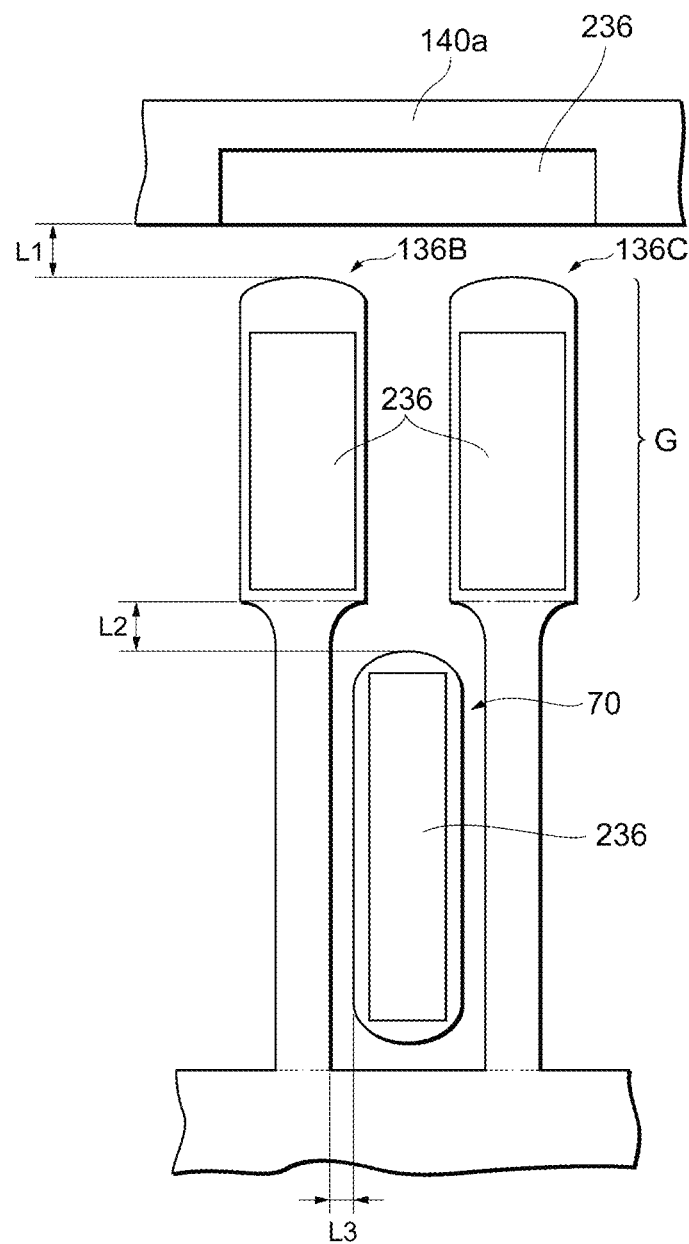
FIG. 11 is a sectional view of a resonator according to a third exemplary embodiment.

Configurations and functions of a resonance device 3 according to a third embodiment will be described with reference to FIG. 11. FIG. 11 corresponds to FIG. 3 and is a diagram obtained by extracting part of a plan view in which the upper lid 30 is removed from the resonance device 3 according to the present embodiment. The resonance device 3 includes vibration arms 136A to 136D (a plurality of vibration arms 136), and a protruding portion 70, instead of the vibration arms 135A to 135D, and the protruding portion 50 of the resonance device 1.

An open end of each one of the plurality of vibration arms 136 is rounded. Additionally, in FIG. 11, the weight portion G of the vibration arm 136 refers to a region closer to an open end side than an alternate long and short dash line indicated for each of the vibration arms 136B and 136C in FIG. 11. Further, each of the vibration arms 136 has a shape in which width thereof gradually increases as a distance to the open end decreases, in a vicinity of a region where the weight portion G is formed. In addition, a tip of the protruding portion 70 along a direction in which the plurality of vibration arms 136 extends is rounded.

In the resonance device 3, the distance L1 refers to a distance between the open end of the vibration arm 136 and the frame body 140a, in an extending direction of the plurality of vibration arms 136, when a surface of the lower lid 20 facing the resonator 10 is viewed in plan. Meanwhile, the distance L2 refers to a distance between the weight portion G and the protruding portion 70 in the extending direction of the plurality of vibration arms 136, when the surface of the lower lid 20 facing the resonator 10 is viewed in plan. Here, when the surface of the lower lid 20 facing the resonator 10 is viewed in plan, a distance between the protruding portion 70 and each of the vibration arms 136B and 136C in a direction orthogonal to the extending direction of the plurality of vibration arms 136 is defined as L3. At this time, in the resonance device 3, the distance L3 is set to be smaller than the distance L1 and smaller than the distance L2. Thereby, it is possible to suppress frequency fluctuation, by reducing influence of an electric charge on a tip side of the vibration arm, compared to influence of an electric charge on a root side of the vibration arm.

It is noted that other configurations of the resonance device 3 are similar to the configurations of the resonance device 1 in the first embodiment.

Fourth Exemplary Embodiment

Figure 12:
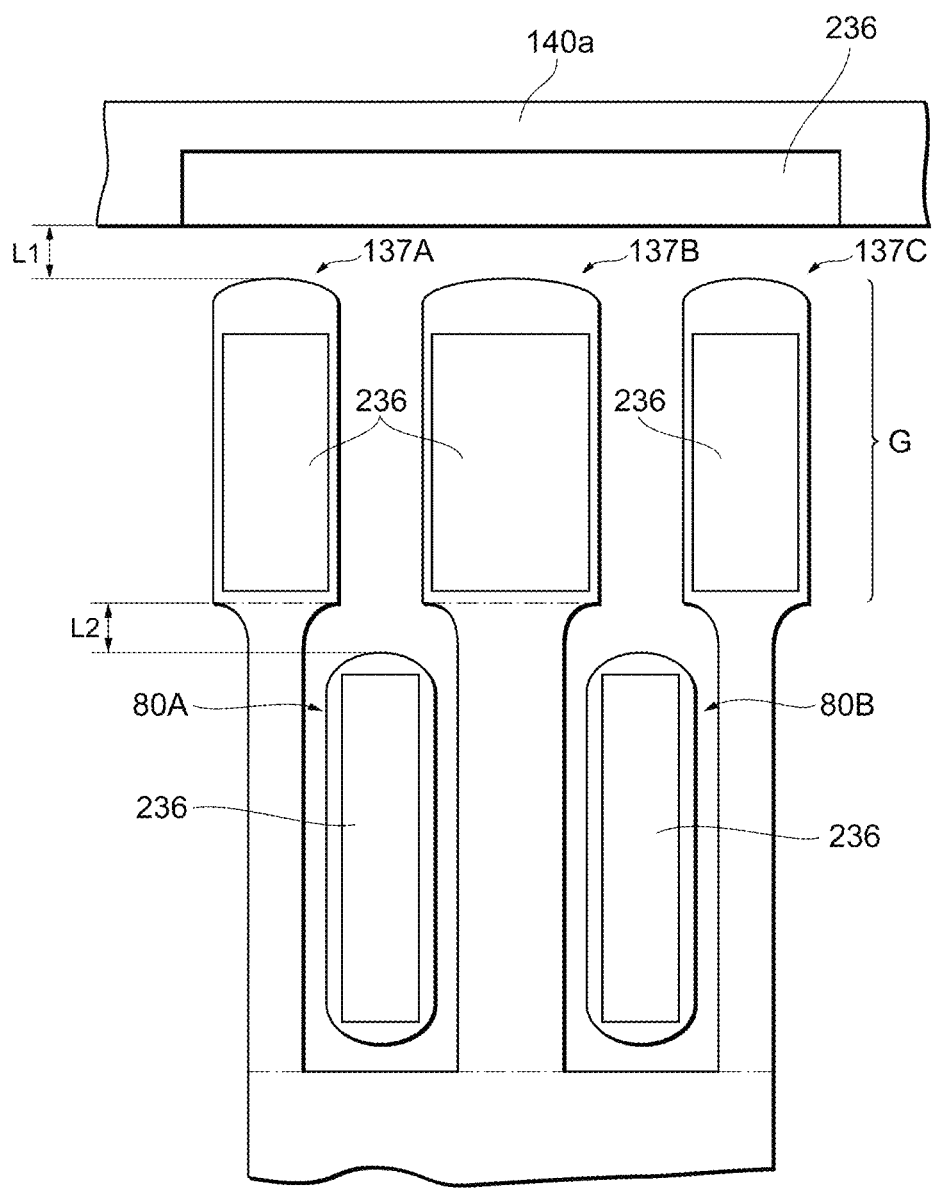
FIG. 12 is a plan view of a resonator according to a fourth exemplary embodiment.

Configurations and functions of a resonance device 4 according to a fourth embodiment will be described with reference to FIG. 12. FIG. 14 corresponds to FIG. 3 and is a diagram of part of a plan view in which the upper lid 30 is removed from the resonance device 4 according to the present embodiment. The resonance device 4 includes vibration arms 137A to 137C (a plurality of vibration arms 137), protruding portions 80A and 80B, instead of the vibration arms 135A to 135D, and the protruding portion 50 of the resonance device 1.

The plurality of vibration arms 137 includes three vibration arms composed of one inner vibration arm, that is, 137B, and two outer vibration arms, that is, 137A and 137C. The outer vibration arms 137A and 137C vibrate in a phase opposite to that of the inner vibration arm 137B. The protruding portion 80A is formed between the vibration arm 137A and the vibration arm 137B. The protruding portion 80B is formed between the vibration arm 137B and the vibration arm 137C.

It is noted that other configurations and functions of the resonance device 4 are similar to those of the resonance device 1.

It is noted that the exemplary embodiments of the present invention have been described above. In particular, the resonance device 1 according to an exemplary embodiment includes the resonator 10 including the vibration portion 120 including the base 130, and the plurality of vibration arms 135 having the fixed end connected to the base 130 and the open end provided away from the base 130, and extending from the fixed end to the open end. Moreover, the base 130 and the plurality of vibration arms 135 having the piezoelectric film F3, the lower electrode E1 and the upper electrode E2 provided so as to face each other with the piezoelectric film F3 interposed therebetween, and the insulating film 235 provided so as to cover the upper electrode E2. The frame 140 is provided so as to extend on the side of the open end of the plurality of vibration arms 135, and the holding arms 111 and 112 are provided for connecting the vibration portion 120 to the holding portion 140. The upper lid 30 is provided so as to face the upper electrode E2 of the resonator 10, and the lower lid 20 is provided so as to face the lower electrode E1 of the resonator 10. In this aspect, the lower lid 20 has the protruding portion 50 protruding between the two vibration arms 135B and 135C adjacent to each other of the plurality of vibration arms 135, the protruding portion 50 having the insulating film 235, each of the vibration arms 135 has the weight portion G provided on the side of the open end and having the width larger than the other parts in the vibration arm 135, the weight portion G having the conductive film 236 formed on the insulating film 235, and when the surface in the lower lid 20 facing the lower electrode E1 is viewed in plan, in the direction in which the plurality of vibration arms 135 extend, compared to the first distance L1 between the weight portion G of any one of the two vibration arms 135B and 135C adjacent to each other and the holding portion 140, the second distance L2 between the weight portion G and the protruding portion 50 is larger than the first distance L1. The second distance L2 is more preferably twice the first distance L1 or more. This makes it possible to reduce influence of Coulomb force due to an electric charge in the protective film 235 or the conductive film 236 on frequency fluctuation of the resonator 10.

Further, it is preferable that the second distance L2 be 20 μm or more. In this case, since the first distance L1 can be secured to be wider, it is possible to further reduce influence of Coulomb force due to an electric charge in the protective film 235 or the conductive film 236 on frequency fluctuation of the resonator 10.

Further, it is preferable that the plurality of vibration arms 135 include three vibration arms, and that a central vibration arm and an outer vibration arm vibrate in respective phases opposite to each other. With this preferable mode, it is possible to cancel respective rotation directional moments of the central vibration arm and the outer vibration arm, and it is possible to obtain resonance with a higher Q.

Further, it is preferable that the plurality of vibration arms 135 include four vibration arms, and that two inner vibration arms and two outer vibration arms vibrate in respective phases opposite to each other. With this preferable mode, it is possible to form the two inner vibration arms with a gap therebetween is increased, and as a result, it is possible to improve $k^2Q$ indicating likelihood of vibration of the resonator.

Further, it is preferable that the conductive film 236 formed in the weight portion G be connected to the upper electrode E2 or the lower electrode E1. Further, the holding portion or frame 140 preferably includes the insulating film 235 and the conductive film 236 formed on the insulating film 235, and the conductive film 236 of the holding portion 140 is preferably connected to the upper electrode E2 or the lower electrode E1. Further, the protruding portion 50 preferably further includes the conductive film 236 formed on the insulating film 235, and the conductive film 236 of the protruding portion 50 is preferably connected to the upper electrode E2 or the lower electrode E1. With this preferable mode, it is possible to further reduce influence of Coulomb force due to an electric charge in the protective film 235 or the conductive film 236 on frequency fluctuation of the resonator 10.

Further, the protruding portion 50 protrudes between parts other than the weight portion G of the two vibration arms 135B and 135C adjacent to each other, and the third distance L3 from the protruding portion 50 to the part other than the weight portion G in each of the vibration arms 135B and 135C is preferably smaller than the first distance L1.

In general, it is noted that the exemplary embodiments described above are intended to facilitate understanding of the present invention, and are not intended to limit the present invention. The present invention can be modified or improved without departing from the gist thereof, and the present invention also includes equivalents thereof. In other words, those in which those skilled in the art make appropriate design changes to the respective embodiments are also included in the scope of the present invention as long as they have the features of the present invention. For example, the elements included in the embodiments, the arrangement, the materials, the conditions, the shapes, the sizes, and the like are not limited to those illustrated, and may be appropriately changed. Moreover, it is possible to partially replace or combine the configurations illustrated in the different embodiments, and these are also included in the scope of the present invention as long as they include the features of the present invention.

For example, in the above-described embodiment, the configuration in which the conductive film 236 is formed in the region in the frame 140 facing the open end of the vibration arm 135 has been described. However, the present invention is not limited thereto, and a configuration may be adopted in which the conductive film 236 is not formed on the front surface of the holding portion 140. Similarly, in the above-described embodiment, the configuration in which the conductive film 236 is exposed on the front surface of the protruding portion 50 has been described, however, the conductive film 236 need not be formed on the protruding portion 50.

In addition, in the above-described embodiment, the configuration in which both the conductive film 236 of the weight portion G and the conductive film 236 of the protruding portion 50 are connected to the metal layer E1 (lower electrode) has been described, but both may be connected to the metal layer E2 (upper electrode). Further, the conductive film 236 of the weight portion G, and the conductive film 236 of the protruding portion 50 need not be connected to the metal layers E1 and E2, and may be in a floating state. In this case, the resonance device 1 does not have the vias V1 to V5.

Further, in the above-described embodiment, the configuration in which each of the protruding portions 50, 60, and 70 is formed between the vibration arms 135B and 135C (that is, between the inner vibration arms) has been described, but the present invention is not limited thereto. It is sufficient that each of the protruding portions 50, 60, and 70 is formed between any of two vibration arms 135 adjacent to each other, that is, between the vibration arms 135A and 135B, or between the vibration arms 135C and 135D. Alternatively, the protruding portion may be formed at all gaps each located between two vibration arms 135.

In addition, in the above-described embodiments, the configuration in which the resonator 10 has the four vibration arms 135, and the configuration in which the resonator 10 has the three vibration arms 137 have been described. However, it is noted that the number of vibration arms 135 included in the resonator 10 may be any number of two or more. For example, in a configuration in which the resonator 10 has five or more vibration arms, two outer vibration arms and vibration arms other than the two outer vibration arms may be configured to vibrate in respective phases opposite to each other. It is sufficient that a protruding portion is formed between at least vibration arms forming a pair and adjacent to each other.

REFERENCE SIGNS LIST 1, 2, 3, 4 RESONANCE DEVICE
10 RESONATOR
20 LOWER LID
30 UPPER LID
50, 60, 70, 80A, 80B PROTRUDING PORTION
111, 112 HOLDING ARM
120 VIBRATION PORTION
130 BASE PORTION
135 (135A TO 135D), 136, 137 VIBRATION ARM
140 HOLDING PORTION
235 PROTECTIVE FILM
236 CONDUCTIVE FILM

The invention claimed is:

1. A resonance device, comprising:
a resonator including:
   a vibration portion that includes a base and a plurality of vibration arms extending therefrom and having a fixed end connected to the base and an open end that opposes the fixed end, wherein the base and the plurality of vibration arms have a lower electrode and an upper electrode that face each other with a piezoelectric film interposed therebetween and an insulating film that covers the upper electrode,
   a frame that extends at least on a side of the open end of the plurality of vibration arms, and
   a holding arm that connects the vibration portion to the frame;
an upper lid that faces the upper electrode of the resonator; and
a lower lid that faces the lower electrode of the resonator,
wherein the lower lid has a protruding portion that has an insulating film and that protrudes between two vibration arms of the plurality of vibration arms,
wherein each of the vibration arms has a weight disposed on a side of the open end, with the weight having a width that is larger than other portions of the vibration arm, and the weight including a conductive film disposed on the insulating film of the respective vibration arm, and
wherein, in a plan view of a surface of the lower lid and in a direction in which the plurality of vibration arms extend, a first distance between the weight of at least one of the two vibration arms and the frame is less than a second distance between the weight and the protruding portion.

2. The resonance device according to claim 1, wherein the first distance is between a side surface of the frame facing the respective weight and a side surface of the respective weight facing the frame.

3. The resonance device according to claim 2, wherein the second distance is between a side surface of the respective weight facing the protruding portion and a side surface of the protruding portion facing the respective weight.

4. The resonance device according to claim 1, wherein the second distance is at least twice the first distance.

5. The resonance device according to claim 1, wherein the second distance is at least 20 µm.

6. The resonance device according to claim 1, wherein the plurality of vibration arms are three vibration arms that include a central vibration arm and an outer vibration arm that vibrate in respective phases opposite to each other.

7. The resonance device according to claim 1, wherein the plurality of vibration arms are four vibration arms that include two inner vibration arms and two outer vibration arms that vibrate in respective phases opposite to each other.

8. The resonance device according to claim 1, wherein the conductive film disposed on the weight is electrically connected to one of the upper electrode or the lower electrode.

9. The resonance device according to claim 1, further comprising a via disposed in a region of at least one of the plurality of vibration arms that electrically connects the conductive film disposed on the weight to one of the upper electrode or the lower electrode.

10. The resonance device according to claim 1, wherein the frame includes an insulating film and a conductive film disposed on the insulating film, and the conductive film of the frame is electrically connected to one of the upper electrode or the lower electrode.

11. The resonance device according to claim 1, wherein the protruding portion further includes a conductive film disposed on the insulating film.

12. The resonance device according to claim 11, wherein the conductive film of the protruding portion is electrically connected to one of the upper electrode or the lower electrode.

13. The resonance device according to claim 1, wherein the protruding portion protrudes between the other portions of the two vibration arms that are adjacent to each other.

14. The resonance device according to claim 13, wherein a third distance from the protruding portion to the other portion of the respective vibration arm is less than the first distance.

15. A resonance device, comprising:
an upper lid;
a lower lid coupled to the upper lid to define a space therebetween; and
a resonator sealed between the upper and lower lids, the resonator including:
   a vibration portion that includes a base and a plurality of vibration arms extending therefrom with respective free ends opposite the base, and with the plurality of vibration arms including an insulating film,
   a frame that at least partially surrounds the vibration portion and includes a side that faces the respective free ends of the plurality of vibration arms, and
   a holding arm that connects the vibration portion to the frame;
wherein the lower lid has a protruding member that has an insulating film and that protrudes between two vibration arms of the plurality of vibration arms,
wherein each of the vibration arms has a weight disposed on a side of the free end and includes a conductive film disposed on the insulating film of the plurality of vibration arms,
wherein a first distance between the weight of at least one of the two vibration arms and the frame is less than a second distance between the weight and the protruding member, and
wherein the first and second directions extend in a direction parallel to a direction in which the plurality of vibration arms extend.

16. The resonance device according to claim 15, wherein the base and the plurality of vibration arms have a lower electrode and an upper electrode that face each other with a piezoelectric film interposed therebetween, and with the insulating film covering the upper electrode.

17. The resonance device according to claim 16, wherein the upper lid faces the upper electrode of the resonator and the lower lid faces the lower electrode of the resonator.

18. The resonance device according to claim 15, wherein the first distance is between a side surface of the frame facing the respective weight and a side surface of the respective weight facing the frame.

19. The resonance device according to claim 18, wherein the second distance is between a side surface of the respective weight facing the protruding portion and a side surface of the protruding portion facing the respective weight.

20. The resonance device according to claim 16, wherein the conductive film disposed on the weight is electrically connected to one of the upper electrode or the lower electrode.

* * * * *